US010373943B2

(12) United States Patent
Takeno et al.

(10) Patent No.: US 10,373,943 B2
(45) Date of Patent: Aug. 6, 2019

(54) SEMICONDUCTOR DEVICE

(71) Applicant: Socionext Inc., Yokohama-shi, Kanagawa (JP)

(72) Inventors: Hirotaka Takeno, Tokyo (JP); Atsushi Okamoto, Tokyo (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 15/953,899

(22) Filed: Apr. 16, 2018

(65) Prior Publication Data

US 2018/0315743 A1   Nov. 1, 2018

(30) Foreign Application Priority Data

Apr. 28, 2017   (JP) .................................. 2017-089407

(51) Int. Cl.
*H01L 27/02* (2006.01)
*H01L 29/08* (2006.01)
(Continued)

(52) U.S. Cl.
CPC .. *H01L 27/0207* (2013.01); *H01L 21/823871* (2013.01); *H01L 23/5286* (2013.01); *H01L 27/088* (2013.01); *H01L 27/092* (2013.01); *H01L 27/11807* (2013.01); *H01L 29/0847* (2013.01); *H01L 29/1095* (2013.01); *H03K 17/161* (2013.01); *H03K 19/0016* (2013.01); *H01L 21/823892* (2013.01); *H01L 27/1203* (2013.01); *H01L 29/0649* (2013.01); *H01L 29/0673* (2013.01); *H01L 29/785* (2013.01);
(Continued)

(58) Field of Classification Search
CPC ............... H01L 23/528; H01L 23/5286; H01L 27/0207; H01L 29/0847; H01L 29/1095; H03K 17/161
USPC ....................................................... 257/401
See application file for complete search history.

(56) References Cited

U.S. PATENT DOCUMENTS

| 2004/0157378 | A1* | 8/2004 | Ikeda | ........................ | G11C 5/14 |
| | | | | | 438/128 |
| 2005/0218959 | A1* | 10/2005 | Yamawaki | .......... | H01L 23/5223 |
| | | | | | 327/334 |

(Continued)

FOREIGN PATENT DOCUMENTS

| JP | 2011-159810 | 8/2011 |
| JP | 2011-243794 | 12/2011 |

(Continued)

*Primary Examiner* — Matthew E Warren
(74) *Attorney, Agent, or Firm* — IPUSA, PLLC

(57) ABSTRACT

A semiconductor device includes a first circuit, a second circuit, a first power supply line, a second power supply line coupled to the first circuit, a third power supply line, a fourth power supply line coupled to the second circuit, a first switch circuit including a first switch transistor and a well tap, the first switch transistor including one source or drain end coupled to the first power supply line and another source or drain end coupled to the second power supply line, the well tap being electrically coupled to the second power supply line, and a second switch circuit including a second switch transistor including one source or drain end coupled to the third power supply line and another source or drain end coupled to the fourth power supply line, the second switch circuit including no well tap electrically coupled to the fourth power supply line.

10 Claims, 20 Drawing Sheets

(51) Int. Cl.
  *H01L 29/10*      (2006.01)
  *H01L 23/528*     (2006.01)
  *H03K 17/16*      (2006.01)
  *H01L 27/088*     (2006.01)
  *H03K 19/00*      (2006.01)
  *H01L 27/118*     (2006.01)
  *H01L 21/8238*    (2006.01)
  *H01L 27/092*     (2006.01)
  *H01L 29/06*          (2006.01)
  *H01L 27/12*          (2006.01)
  *H01L 29/78*          (2006.01)

(52) U.S. Cl.
  CPC ............... *H01L 2027/11875* (2013.01); *H01L 2027/11881* (2013.01)

(56) References Cited

U.S. PATENT DOCUMENTS

2009/0309418 A1* 12/2009 Motomura ............ G06F 1/3287
                                                     307/38
2015/0365089 A1    12/2015 Momiyama
2017/0194949 A1*  7/2017 Srivastava ......... H03K 3/35625

FOREIGN PATENT DOCUMENTS

| JP | 2012-234593 | 11/2012 |
| JP | 2013-110419 | 6/2013 |
| JP | 2016-001652 | 1/2016 |

* cited by examiner

SEMICONDUCTOR DEVICE

CROSS-REFERENCE TO RELATED APPLICATIONS

The present application is based upon and claims the benefit of priority from the prior Japanese Patent Application No. 2017-089407 filed on Apr. 28, 2017, with the Japanese Patent Office, the entire contents of which are incorporated herein by reference.

BACKGROUND OF THE INVENTION

1. Field of the Invention

The disclosures herein relate to a semiconductor device.

2. Description of the Related Art

As known in the art of semiconductor devices, technologies for reducing leak current in a target circuit cut the power to the target circuit when it is not operating. In such technologies, a power switch circuit is provided between a power supply line and a target circuit in a semiconductor device. Power voltage is applied to the target circuit via the power switch circuit when the target circuit is to operate, and is cut by the power switch circuit when the target circuit is not to operate.

Specific technologies known in the art include semiconductor devices and the like which include a switch cell to supply or cut the power to an area for which power supply is stoppable (see Patent Document 1, for example).

However, no known technologies provide the configuration of power switch circuits usable for respective, different types of target circuits.

[Patent Document 1] Japanese Patent Application Publication No. 2013-110419
[Patent Document 2] Japanese Patent Application Publication No. 2016-001652
[Patent Document 3] Japanese Patent Application Publication No. 2011-159810
[Patent Document 4] Japanese Patent Application Publication No. 2011-243794
[Patent Document 5] Japanese Patent Application Publication No. 2012-234593

SUMMARY OF THE INVENTION

It is a general object of the present invention to provide a semiconductor device that substantially obviates one or more problems caused by the limitations and disadvantages of the related art.

According to an embodiment, a semiconductor device includes a first circuit formed in a semiconductor substrate, a second circuit formed in the semiconductor substrate, a first power supply line, a second power supply line coupled to the first circuit, a first ground line, a third power supply line, a fourth power supply line coupled to the second circuit, a second ground line, a first switch circuit including a first switch transistor and a well tap of the semiconductor substrate, the first switch transistor including a first source and a first drain, one of the first source and the first drain being coupled to the first power supply line, another of the first source and the first drain being coupled to the second power supply line, and the well tap being electrically coupled to the second power supply line, and a second switch circuit including a second switch transistor, the second switch transistor including a second source and a second drain, one of the second source and the second drain being coupled to the third power supply line, another of the second source and the second drain being coupled to the fourth power supply line, the second switch circuit including no well tap of the semiconductor substrate electrically coupled to the fourth power supply line.

According to at least one embodiment, power switch circuits usable for respective, different types of target circuits are provided.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

First Embodiment

In the following, power gating will be first described with reference to drawings, ahead of the description of a first embodiment.

Figure 1:
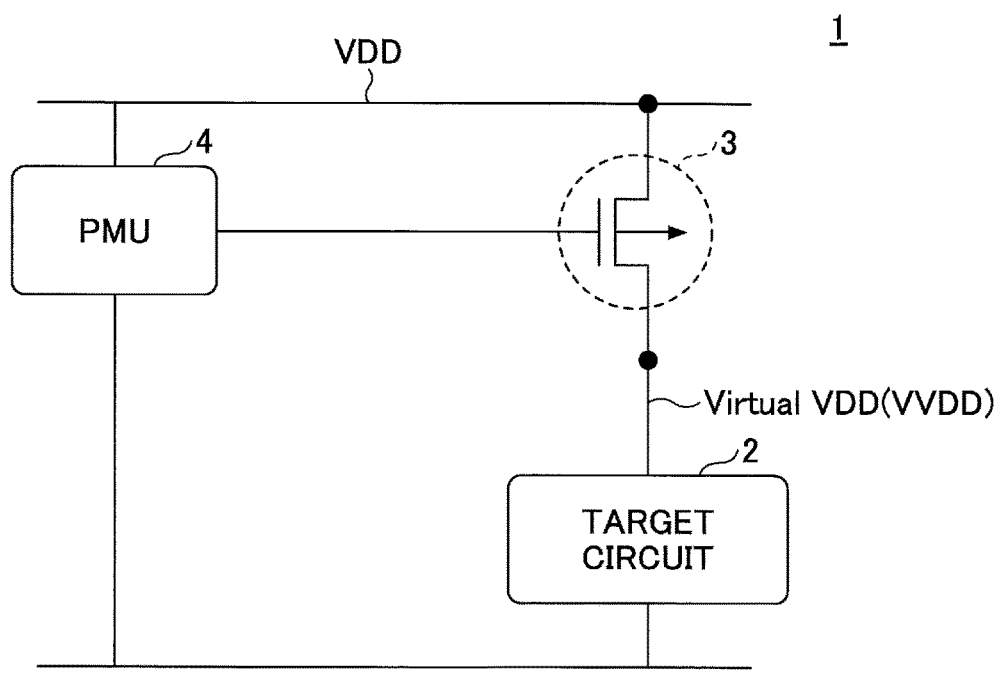
FIG. 1 is a drawing illustrating power gating.

FIG. 1 is a drawing illustrating power gating; For power gating, a MOS (metal-oxide semiconductor) switch 3 is placed between a power supply line VDD and a target circuit 2 in a semiconductor device 1. Supply of power voltage from the power supply line VDD to the target circuit 2 is controlled. The MOS switch 3 is an example of a power switch circuit to control whether to supply or cut the power to the target circuit 2.

In the semiconductor device 1, the MOS switch 3 is placed in the off state by a PMU (power management unit) 4 to cut the power to the target circuit 2. In the semiconductor device 1, the MOS switch 3 is placed in the on state by the PMU 4 when the target circuit 2 is to operate. As the MOS switch 3 is placed in the on state, a power supply line Virtual VDD (which will hereinafter be referred to as VVDD) for supplying power to the target circuit 2 is coupled to the power supply line VDD, thereby supplying power to the target circuit 2.

Power gating is a power reduction technology that controls whether to supply or cut the power to the target circuit 2 to reduce the occurrence of leak current in the target circuit 2.

A typical semiconductor device includes various types of circuits implemented as target circuits. Specifically, target circuits may include logic circuits such as standard cells, RAM circuits such as SRAMs (static random access memories), analog macro circuits, and the like. The analog macro circuits may include analog-to-digital conversion circuit (ADC) for converting analog signals from an external device into digital signals, a digital-to-analog conversion circuit (DAC) for converting digital signals into analog circuits, and the like.

There may be a case in which the threshold voltage of a transistor is controlled by applying potential not only to the source and drain of the transistor but also to the substrate. In the following, an area for applying potential to the substrate (i.e., applying potential to a well formed in the substrate) will be referred to as a well-tap area.

In some cases, a standard cell may not include a well-tap area. In these cases, a well-tap area is disposed in addition to such a standard cell where the standard cell is placed. In the case of such a standard cell being a target circuit, a well-tap area is disposed inside a power switch circuit.

In contrast, analog macro circuits, memory circuits, and the like may include a well-tap area disposed inside these circuits. When such circuits including a well-tap area are target circuits, the well-tap area inside a power switch circuit may not be used.

In consideration of the above, the following embodiments will utilize, in a semiconductor device, power switch circuits that are usable for a target circuit including no area for applying potential to the substrate and usable for a target circuit including an area for applying potential to the substrate, respectively.

More specifically, a power switch circuit including a well-tap area is used for a target circuit including no area for applying potential to the substrate, thereby controlling whether to supply or cut power in the semiconductor device. Further, a power switch circuit including no well-tap area is used for a target circuit including an area for applying potential to the substrate, thereby controlling whether to supply or cut power in the semiconductor device.

As described above, the present embodiment utilizes power switch circuits usable for respective, different types of target circuits. A wasted circuit area for wasted well-tap areas is thus eliminated in a semiconductor device, which serves to reduce the size of the semiconductor device.

Figure 2B:
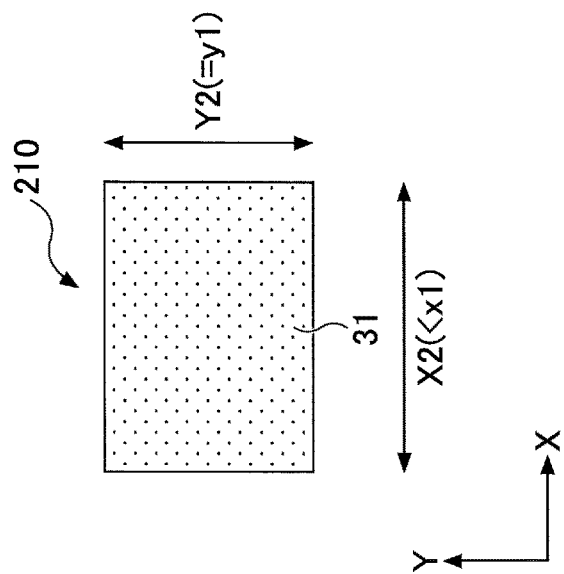
FIGS. 2A and 2B are drawings illustrating power switch circuits according to a first embodiment.
Figure 2A:
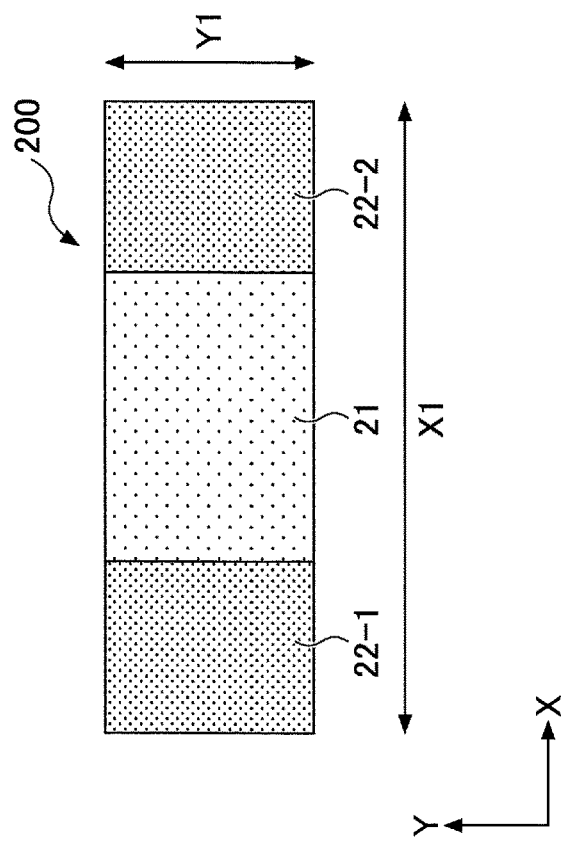

In the following, a power switch circuit of the present embodiment will be described with reference to FIGS. 2A and 2B. FIGS. 2A and 2B are drawings illustrating power switch circuits according to a first embodiment. FIG. 2A is a drawing schematically illustrating a power switch circuit including a well-tap area. FIG. 2B is a drawing schematically illustrating a power switch circuit including no well-tap area.

A power switch circuit 200 illustrated in FIG. 2A includes a power switch section 21 and well-tap areas 22-1 and 22-2 adjoining the power switch section 21 on the respective sides thereof. A power switch circuit 210 illustrated in FIG. 2B is a power switch section 31 by itself, without the well-tap areas 22-1 and 22-2. In the present embodiment, the power switch section 21 and the power switch section 31 include the same configuration.

Because of the noted structure, a width X2 of the power switch circuit 210 in the X-axis direction is narrower than a width X1 of the power switch circuit 200 in the X-axis direction in the X-Y coordinate system illustrated in FIG. 2. A width Y1 of the power switch circuit 200 and a width Y2 of the power switch circuit 210 in the Y-axis direction are equal to each other.

As described above, the present embodiment makes selective use of the power switch circuit 200 and the power switch circuit 210 depending on the type of a target circuit, thereby reducing the implemented circuit area compared to the case in which the power switch circuits 200 are used for all the target circuits.

In the following, the power switch circuit 200 may sometimes be referred to as a first power switch circuit, and the power switch circuit 210 may sometimes be referred to as a second power switch circuit. The details of the power switch circuit 200 and the power switch circuit 210 will be described later.

Figure 3A:
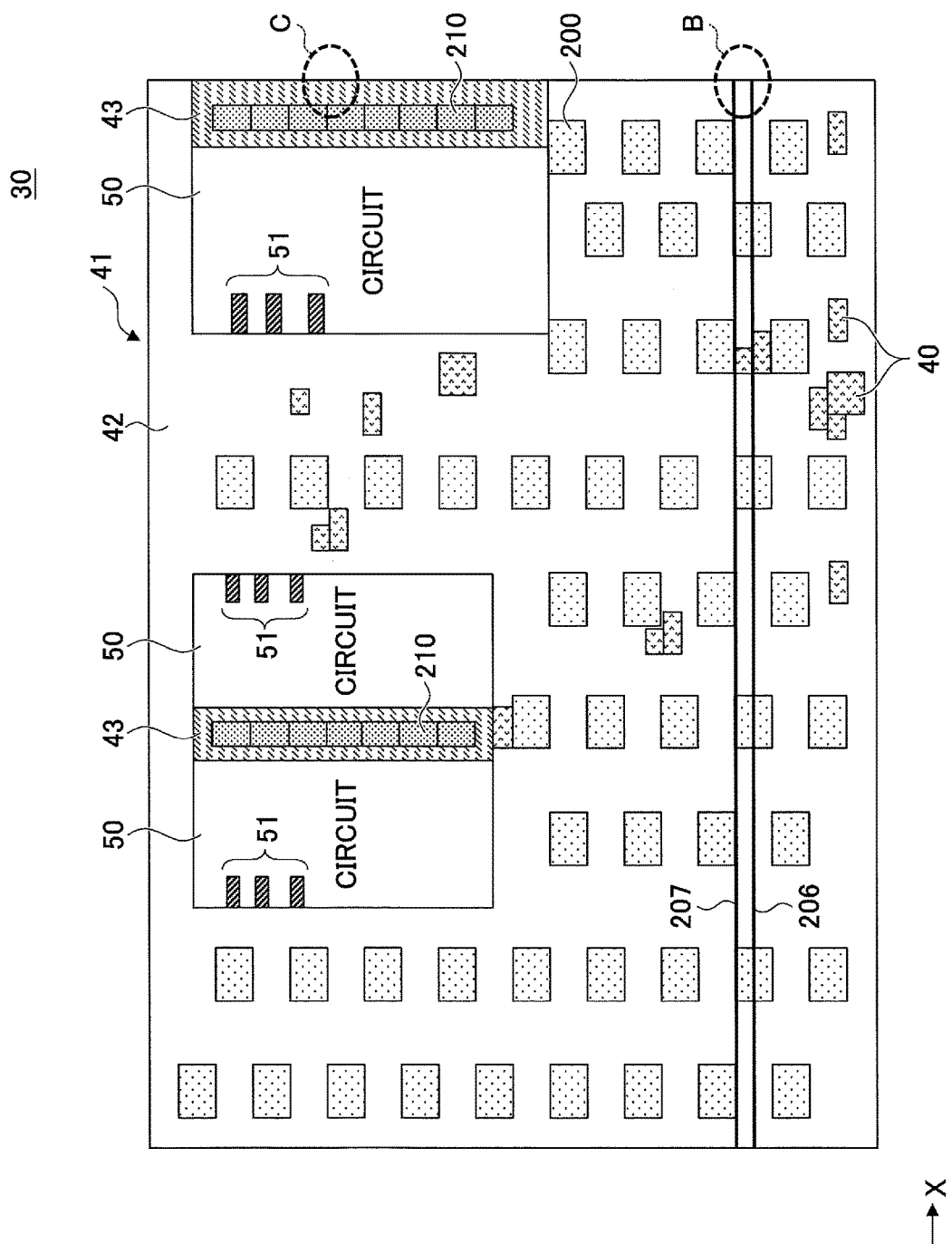
FIGS. 3A through 3C are drawings illustrating an example of a semiconductor device of the first embodiment.
Figure 3B:
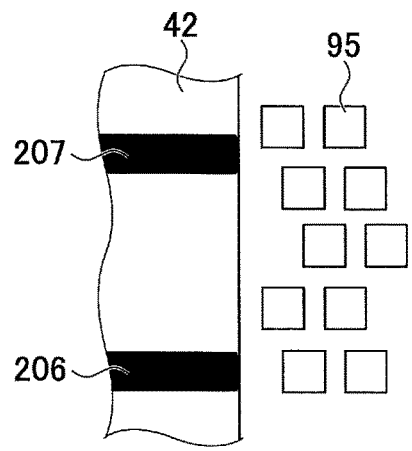
Figure 3C:
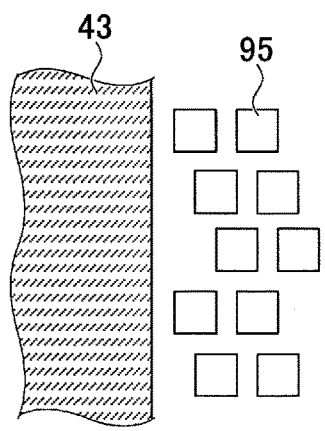

In the following, a semiconductor device according to the present embodiment will be described. FIGS. 3A through 3C are drawings illustrating an example of a semiconductor device of the first embodiment. FIG. 3A is a plan view of an area 41 in which a target circuit is placed in a semiconductor device 30. FIG. 3B is an enlarged view of an area enclosed in a dotted circle B in FIG. 3A. FIG. 3C is an enlarged view of an area enclosed in a dotted circle C in FIG. 3A.

The area 41 of the semiconductor device 30 of the present embodiment includes an area 42 in which standard cells (logic circuits) 40 and the like are disposed, and includes an area 43 in which the standard cells (logic circuits) 40 and the like are not disposed. Further, the area 41 includes circuits 50, such as RAMs and analog circuits, including an area for applying potential to the substrate.

In the following, the area 42 in which the standard cells (logic circuits) 40 and the like are disposed will be referred to as a first area, and the area 43 in which the standard cells (logic circuits) 40 and the like are not disposed will be referred to as a second area. The second area 43 includes the power switch circuits 210 and others disposed therein. The first area 42 includes the power switch circuits 200 disposed in a staggered arrangement, for example.

The area 41 includes power supply lines 206 and 207, which are coupled to the standard cells 40 and the like. The power supply lines 206 and 207 extend in the X direction. As illustrated in FIG. 3A, the power supply lines 206 and 207 may be terminated at the edges of the area 41 (or the first area 42). Power supply lines 306 and 307, which will be described later, may also be terminated at the edges of the area 41 (or the second area 43). It may be noted that, although FIG. 3A illustrates only one pair of power supply lines 206 and 207, a plurality of pairs of power supply lines 206 and 207 may be provided.

As illustrated in FIGS. 3B and 3C, the present embodiment may include dummy line patterns situated outside the area 41 (i.e., outside the first area 42 and the second area 43). In FIG. 3B, the dummy line patterns 95 is disposed outside the first area 42. In FIG. 3C, the dummy line patterns 95 is disposed outside the second area 43.

The dummy line patterns 95 refer to line patterns that are not coupled to the transistors or lines of the circuits, for example. Provision of the dummy line patterns 95 serves to improve evenness of the production process for forming lines.

The power supply lines 206 and 207 extending in the X direction in the present embodiment may be terminated before reaching the dummy line patterns 95 as illustrated in FIG. 3B.

In the present embodiment, the power supply lines 306 and 307, which are disposed in the second area 43 and will be described later, may also be terminated before reaching the dummy line patterns 95. The dummy line patterns 95 may be arranged to surround the area 41.

When another circuit area is disposed alongside the area 41, dummy line patterns may not be placed. In such a case, the power supply lines 206 and 207 and the power supply lines 306 and 307 may be terminated before reaching such an adjoining circuit area.

The example illustrated in FIGS. 3A through 3C depicts only some and not all of the standard cells 40 implemented in the first area 42. The first area 42 in actuality may include a larger number of standard cells 40 implemented therein.

The second area 43 includes an area between the circuits 50, an area between one of the circuits 50 and an edge of the area 41, and the like. In the second area 43, the power switch circuits 210 are aligned in the Y direction along one or more circuits 50.

As described above, the semiconductor device 30 of the present embodiment include the first area 42 in which the power switch circuits 200 usable for the standard cells 40 are disposed, and include the second area 43 in which the power switch circuit 210 usable for the circuits 50 are disposed. This arrangement allows the size of the second area 43 to be reduced compared with the case in which the power switch circuits 200 are used for all the standard cells 40 and the circuits 50, thereby serving to reduce the size of the semiconductor device 30.

Some of the circuits 50 include an edge situated alongside the first area 42 and an edge situated alongside the second area 43. Terminals 51 for coupling to the standard cells 40 in the first area 42 are disposed along the edge situated alongside the first area 42. The terminals 51 may be used by the circuits 50 to receive signals from the standard cells 40 and to transmit signals from the circuits 50 to the standard cells 40. The terminals 51 are preferably arranged at the edge alongside the first area 42 for the purpose of reducing signal attenuation and the like. In contrast, the second area 43 is preferably situated alongside the edge of the circuit 50 where no terminals 51 are disposed, from the viewpoint of an efficient circuit arrangement.

The terminals 51 illustrated in FIG. 3A are examples only. The number of terminals 51 disposed in one of the circuits 50 may be two, or may be four or more.

Figure 4:
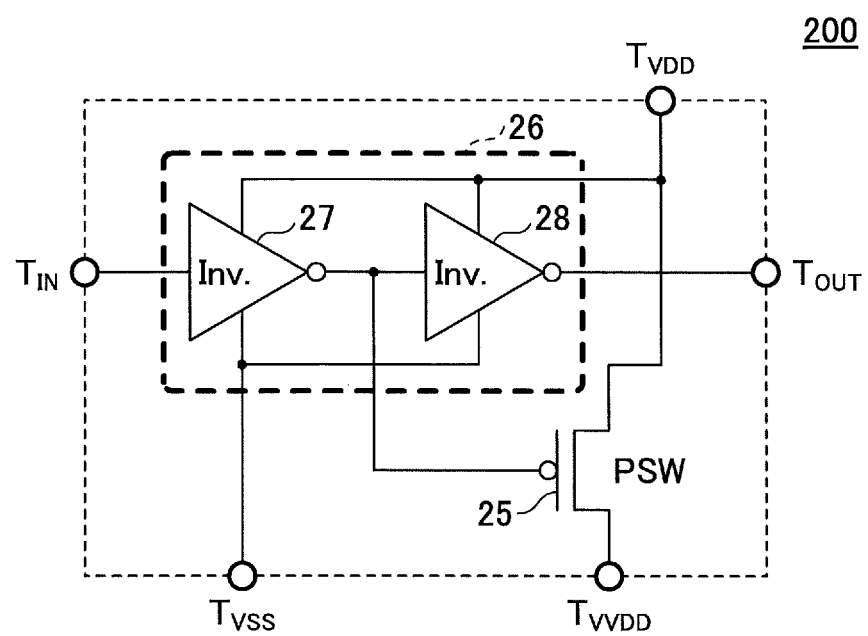
FIG. 4 is a drawing schematically illustrating a power switch circuit according to the first embodiment.

In the following, a description will be given of the power switch circuit 200 and the power switch circuit 210 according to the present embodiment. FIG. 4 is a drawing schematically illustrating a power switch circuit according to the first embodiment.

The power switch circuit 200 and the power switch circuit 210 of the present embodiment are each a power switch circuit with one input and one output. The power switch circuit 200 and the power switch circuit 210 of the present embodiment have the same circuit configuration. FIG. 4 illustrates the power switch circuit 200 as a representative example.

The power switch circuit 200 of the present embodiment includes a transistor 25, a buffer 26, a $T_{IN}$ terminal, a $T_{OUT}$ terminal, a $T_{VDD}$ terminal, a $T_{VVDD}$ terminal, and a $T_{VSS}$ terminal.

The transistor 25 is a switch transistor. The buffer 26, which includes an inverter 27 and an inverter 28, drives the transistor 25.

The $T_{IN}$ terminal, which is coupled to the input of the buffer 26, receives a control signal for controlling whether to supply or cut the power to a target circuit. The $T_{OUT}$ terminal, which is coupled to the output of the buffer 26, transmits the control signal applied to the $T_{IN}$ terminal. The $T_{VDD}$ terminal, which is coupled to one end of the transistor 25, is coupled to the power supply. The $T_{VVDD}$ terminal, which is coupled to the other end of the transistor 25, is coupled to the target circuit.

The transistor 25 is a PMOS transistor having the on and off states which are controlled in response to the signal supplied from the inverter 27 of the buffer 26. The inverter 27 is coupled to the $T_{VSS}$ terminal and to the $T_{VDD}$ terminal. The $T_{VSS}$ terminal is a ground connection terminal that is coupled to the ground.

In the present embodiment, the on state of the transistor 25 causes the $T_{VDD}$ terminal and the $T_{VVDD}$ terminal to be coupled to each other, so that the power supply potential to which the $T_{VDD}$ terminal is connected is supplied to the $T_{VVDD}$ terminal. The power supply potential is thus supplied from the $T_{VVDD}$ terminal to the target circuit.

The off state of the transistor 25 causes the power to the $T_{VVDD}$ terminal to be cut.

Figure 5:
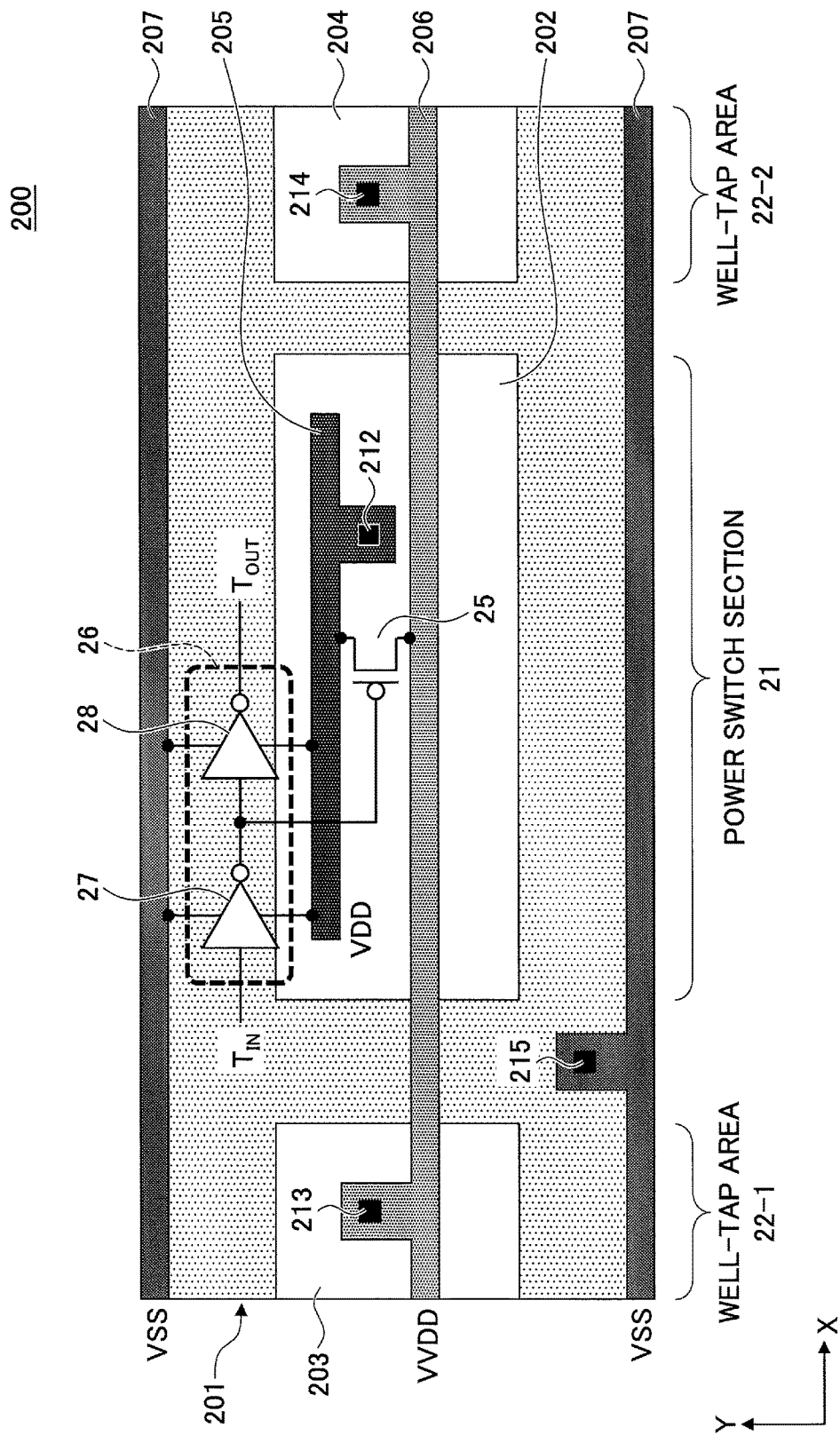
FIG. 5 is a drawing illustrating coupling between the well-tap areas and power supply of a first power switch circuit of the first embodiment.

In the following, the power switch circuit 200 of the present embodiment will be described with reference to FIG. 5 through FIG. 7. FIG. 5 is a drawing illustrating coupling between the well-tap areas and power supply of a first power switch circuit of the first embodiment.

The power switch circuit 200 of the present embodiment includes N-type wells 202, 203, and 204 formed in a P-type substrate 201. The power switch circuit 200 of the present embodiment further includes a power supply line 205 corresponding to the power supply line VDD, a power supply line 206 corresponding to the power supply line VVDD, and power supply lines 207 corresponding to the power supply line VSS.

The power supply line 205, which is formed over the P-type substrate 201, is electrically coupled to the N-type well 202. The power supply line 206 is formed over the P-type substrate 201 to span across the N-type wells 202, 203, and 204 in a plan view. The power supply line 206 is electrically coupled to the N-type wells 203 and 204.

At least part of the N-type well 203 is included in the well-tap area 22-1, and at least part of the N-type well 204 is included in the well-tap area 22-2.

The transistor 25 is formed to provide coupling between the power supply line 205 and the power supply line 206 in the N-type well 202. The gate electrode of the transistor 25 is coupled to the output of the first inverter 27 of the buffer 26. The inverter 27 and the inverter 28 are coupled between the power supply line 205 and the power supply lines 207.

A contact 217 is formed above the N-type well 202 and the N-type well 202 is coupled to the power supply line 205 via the contact 217. A contact 213 and a contact 214 are formed above the N-type wells 203 and 204 respectively. The N-type wells 203 and 204 are coupled to the power supply line 206 corresponding to the power supply line VVDD via the contact 203 and 204 respectively.

In the present embodiment, the potential of the power supply line VVDD is applied to the substrate of the target circuit through the N-type wells 203 and 204.

It may be noted that a standard cell is formed to include transistors disposed between the power supply line 206 and the power supply line 207 extending in the same direction. When target circuits are standard cells, thus, the target circuits are aligned one next to another in the direction in which the power supply lines 206 and 207 extend. The power switch circuit 200 of the present embodiment includes the well-tap areas 22-1 and 22-2 aligned on the respective ends of the power switch circuit 200 in the direction in which power supply lines 206 and 207 extend, thereby being capable of efficiently supplying potential to standard cells.

It may be noted that the standard cells 40 may not only be formed between the power supply line 206 and the power supply line 207 adjacent to each other, but also be formed for coupling to the power supply line 206 and the power supply line 207 that are not adjacent to each other.

In the following, the direction in which the power supply lines 206 and 207 extend is referred to as the X-axis direction (or the first direction), and the direction perpendicular to the X-axis direction is referred to as the Y-axis direction (or the second direction).

Although the present embodiment is directed to the configuration in which the well-tap areas 22-1 and 22-2 are formed on the respective sides of the power switch section 21, this is not a limiting example. The power switch circuit 200 may include only one of the well-tap areas 22-1 and 22-2 formed therein when a target circuit needing potential to be applied thereto is situated only on one side of the power switch section 21.

In the following, the power switch circuit 200 of the present embodiment will be described with reference to FIG. 6 and FIG. 7.

Figure 6:
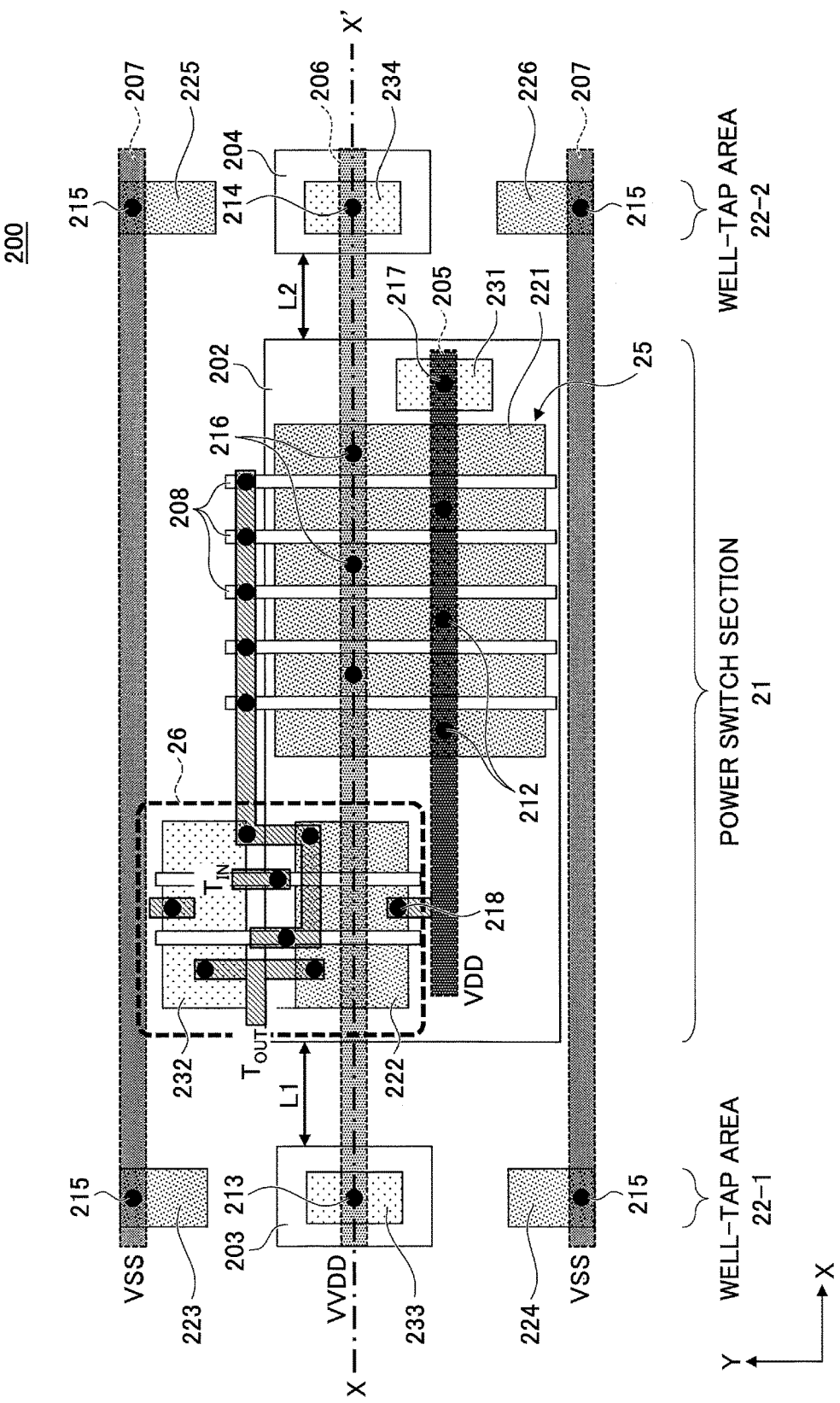
FIG. 6 is a drawing illustrating the layout of the first power switch circuit according to the first embodiment.

FIG. 6 is a drawing illustrating the layout of the first power switch circuit according to the first embodiment. FIG. 7 is a drawing illustrating a cross-section of the first power switch circuit according to the first embodiment. FIG. 7 illustrates the cross section taken along the X-X' line in FIG. 6.

The power switch circuit 200 of the present embodiment includes the P-type substrate 201, the N-type wells 202 through 204, STIs (shallow trench isolations) 281 through 283, the power supply lines 205 through 207, gate electrodes 208, P-type impurity regions 221 through 226, N-type impurity regions 231 through 234, and contacts 212 through 218.

The power switch circuit 200 of the present embodiment includes the N-type wells 202 through 204 formed in the P-type substrate 201. The P-type impurity regions 221 and 222 and the N-type impurity region 231 are formed in the N-type well 202. The N-type impurity region 233 is formed in N-type well 203. The N-type impurity region 234 is formed in the N-type well 204.

In the present embodiment, the N-type impurity regions 232 and the P-type impurity regions 223 through 226 are formed in the P-type substrate 201.

The P-type impurity regions 221, which have a higher doping concentration than the P-type substrate 201, form the source and drain regions of the transistor 25. The transistor 25 includes the gate electrodes 208, gate insulating films 252, and sidewalls 253 and 254. In the present embodiment, the gate electrodes 208 are electrically coupled to the output of the inverter 27. In the present embodiment, a plurality of transistors 25 may be coupled in parallel to each other.

The transistors of the inverters of the buffer 26 include source and drain regions as a part of the P-type impurity regions 222 and the N-type impurity regions 232. The P-type impurity regions 222 have a higher doping concentration than the P-type substrate 201. The transistors of the inverters constituting the buffer 26 include gate electrodes 271, gate insulating films 272, and sidewalls 273 and 274.

The power switch circuit 200 of the present embodiment includes the STIs 281 through 283 formed in the P-type substrate 201 between the N-type wells and between the transistors. Further, a first interlayer insulating film 261 is formed over the P-type substrate 201.

Figure 7:
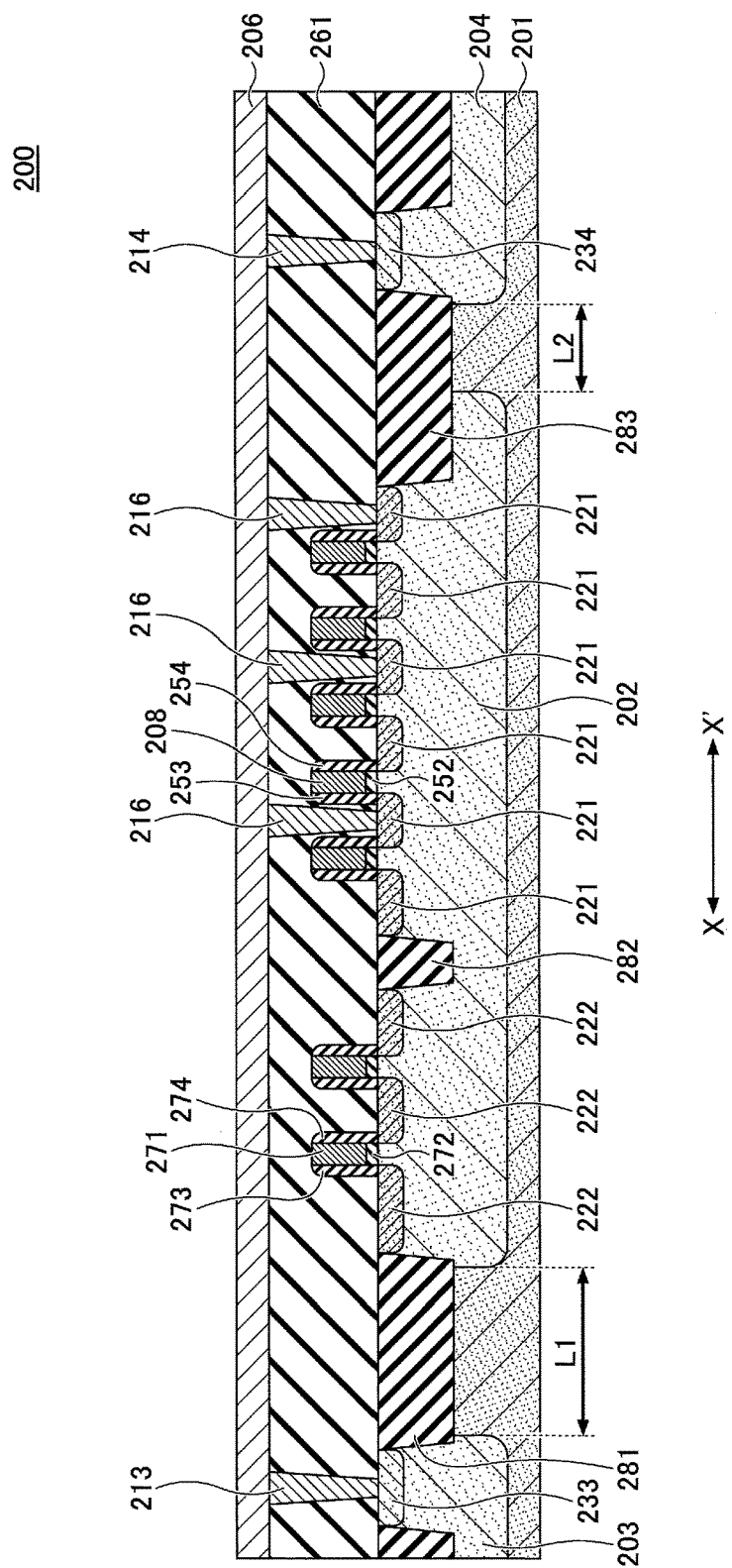
FIG. 7 is a drawing illustrating a cross-section of the first power switch circuit according to the first embodiment.

In the example illustrated in FIG. 7, interconnections such as the power supply lines 205 through 207 are formed inside a second interlayer insulating film that is formed over the first interlayer insulating film 261. The second interlayer insulating film may be made of a low dielectric constant material such as a porous film or an SiOC (silicon oxycarbide) film.

In the present embodiment, the N-type well 202 and the N-type well 203 are arranged at a distance of L1 from each other in the X-axis direction. Further, the N-type well 202 and the N-type well 204 are arranged at a distance of L2 from each other in the X-axis direction.

In the present embodiment, the distance L1 and distance L2 are such a length as to reduce an effect of a difference between the potential of the power supply line VDD applied to the N-type well 202 and the potential of the power supply line VVDD applied to the N-type well 203 and the N-type well 204.

Some of the P-type impurity regions 221 are coupled to the power supply line 205 through the contacts 212 formed through the first interlayer insulating film 261, and the others are coupled to the power supply line 206 through the contacts 216 formed through the first interlayer insulating film 261.

One of the P-type impurity regions 222 is coupled to the power supply line 205 through the contact 218 formed through the first interlayer insulating film 261.

The P-type impurity regions 221 and the P-type impurity regions 222 are isolated from each other by the STI 282. The P-type impurity regions 221 and the N-type impurity region 231 are isolated from each other by the STI 283.

The N-type impurity region 231 is coupled to the power supply line 205 through the contact 217 formed through the first interlayer insulating film 261.

The N-type impurity region 233 is coupled to the power supply line 206 through the contact 213 formed through the first interlayer insulating film 261, so that the power supply line 206 is electrically coupled to the N-type well 203, which is connected to the N-type well of a target circuit situated next to the well-tap area 22-1.

The N-type impurity region 234 is coupled to the power supply line 206 through the contact 214 formed through the first interlayer insulating film 261, so that the power supply line 206 is electrically coupled to the N-type well 204, which is connected to the N-type well of a target circuit situated next to the well-tap area 22-2.

The P-type impurity region 223 and the P-type impurity region 224 are coupled to the power supply lines 207, respectively, through the contacts 215 formed through the first interlayer insulating film 261. The P-type impurity region 223 and the P-type impurity region 224 allows the power supply lines 207 to be connected to the P-type substrate or to the P-type well of the target circuit situated next to the well-tap area 22-1, thereby applying the potential of the power supply lines 207 to the target circuit.

The P-type impurity region 225 and the P-type impurity region 226 are coupled to the power supply lines 207, respectively, through the contacts 215 formed through the first interlayer insulating film 261. The P-type impurity region 225 and the P-type impurity region 226 allows the power supply lines 207 to be connected to the P-type substrate or to the P-type well of the target circuit situated next to the well-tap area 22-2, thereby applying the potential of the power supply lines 207 to the target circuit.

As described above, the power switch circuit 200 of the present embodiment includes the N-type impurity regions 233 and 234 of the respective well-tap areas 22-1 and 22-2 connected to the power supply line VVDD, and also includes the P-type impurity regions 221 of the power switch section 21 connected to the power supply line VDD.

Moreover, the N-type well 202 of the power switch section 21 and the N-type wells 203 and 204 of the respective well-tap areas 22-1 and 22-2 are arranged at a distance of L1 or L2 from each other in the present embodiment.

The contacts 212 through 218 of the present embodiment include a glue film which includes titanium nitride, and a tungsten film, for example. The power supply lines 205 through 207 include copper and a barrier metal film which includes tantalum or tantalum nitride, for example. The first interlayer insulating film 261 may include a silicon dioxide film, for example. The STIs 281 through 283 may include a silicon dioxide film, for example.

In the present embodiment, the gate electrodes 208 and 271 may include polysilicon or metal such as titanium nitride. The gate insulating films 252 and 272 may include a silicon dioxide film or a film which includes one or more materials of an oxide of hafnium, zirconium, lanthanum, yttrium, aluminum, titanium, and tantalum.

The layout illustrated in FIG. 6 is the layout of planar transistors, which is not a limiting example. The power switch circuit 200 may include fin transistors (i.e., FinFETs) or nanowire transistors arranged therein, for example. In such a case, gate electrodes extending in the Y-axis direction may extend, in a plan view, across the fins of a FinFET structure or the nanowires of a nanowire transistor which extend in the X-axis direction. A FinFET-structure transistor and a nanowire transistor will be described in detail later.

Figure 8:
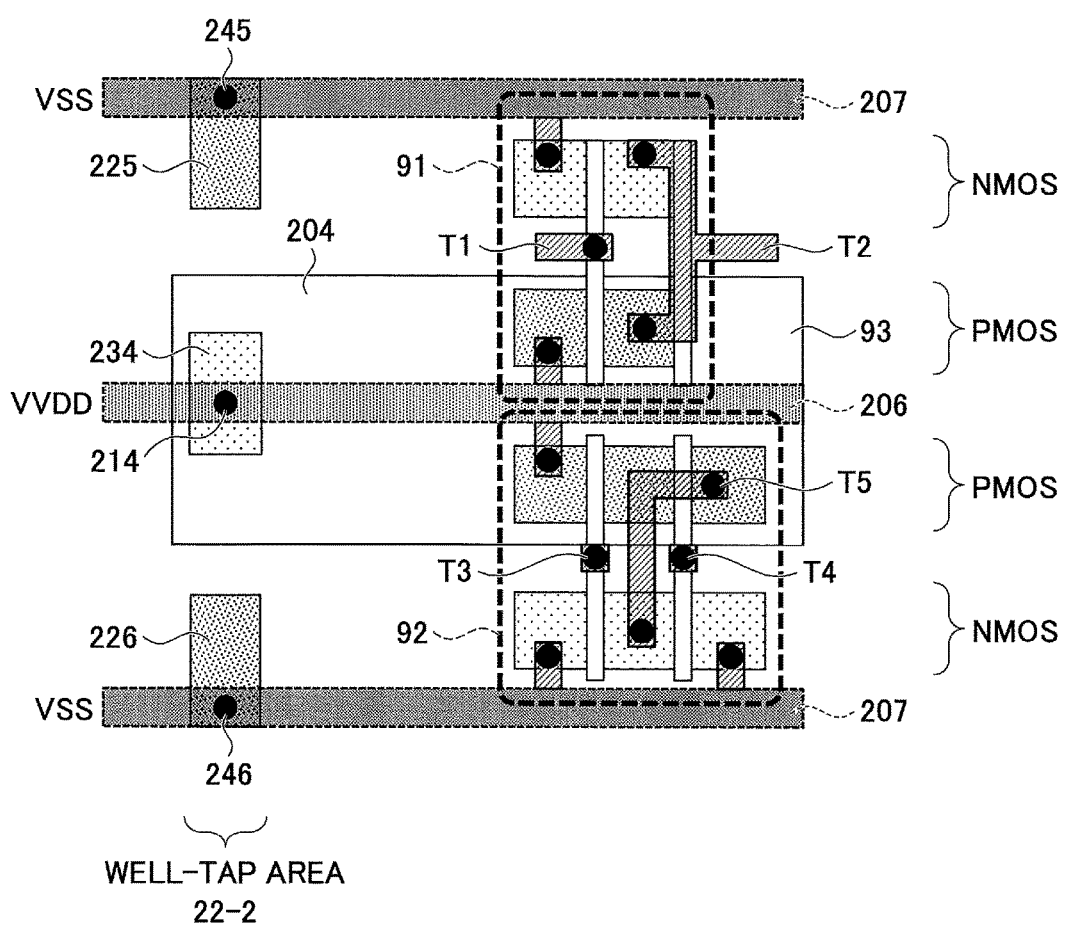
FIG. 8 is a drawing illustrating coupling between a target circuit and the first power switch circuit of the first embodiment.

In the following, coupling between the power switch circuit 200 and a target circuit will be described with reference to FIG. 8. FIG. 8 is a drawing illustrating coupling between a target circuit and the first power switch circuit of the first embodiment.

FIG. 8 illustrates an example in which a target circuit 91 and a target circuit 92 are implemented on the right-hand side of the well-tap area 22-2 of the power switch circuit 200 according to the present embodiment. The target circuits 91 and 92 are examples of standard cells.

The target circuit 91 is an inverter including an input terminal T1 and an output terminal T2. The target circuit 92 is a NAND gate including an input terminal T3 and an output terminal T4.

In the example illustrated in FIG. 8, an N-type well 93 of the target circuit 91 and the target circuit 92 is connected to the N-type well 204 of the well-tap area 22-2, thereby receiving potential applied thereto.

It may be noted that the inverter and the NAND gate are examples of standard cells, and standard cells are not limited to these examples.

In the following, the power switch circuit 210, which is the second power switch circuit of the present embodiment, will be described with reference to FIG. 9.

Figure 9:
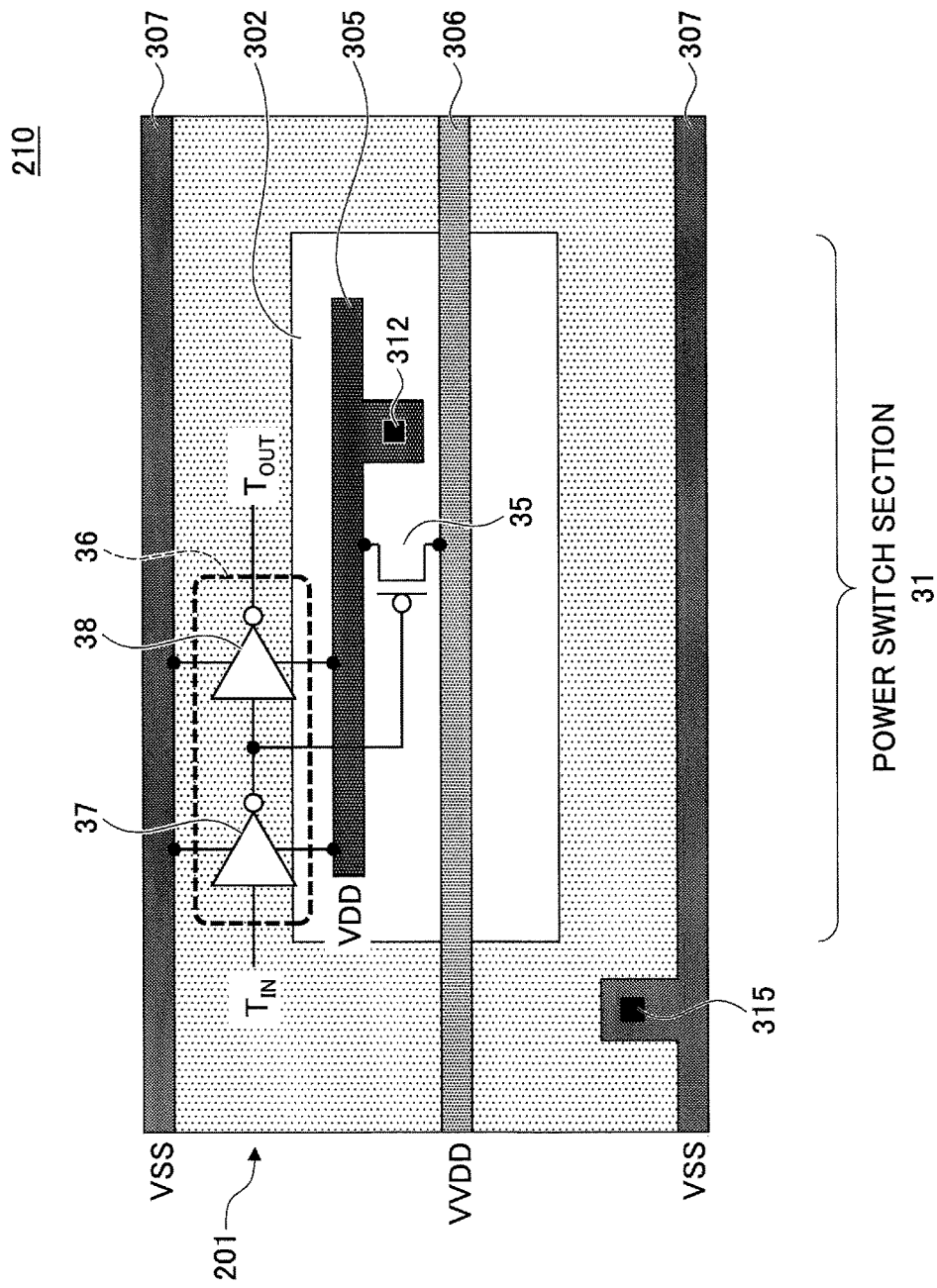
FIG. 9 is a drawing illustrating a second power switch circuit according to the first embodiment.

FIG. 9 is a drawing illustrating the second power switch circuit according to the first embodiment. The power switch circuit 210 of the present embodiment differs from the power switch circuit 200 in that the well-tap areas 22-1 and 22-2 are not provided.

The power switch circuit 210 of the present embodiment includes an N-type well 302 formed in the P-type substrate 201. The power switch circuit 210 of the present embodiment further includes a power supply line 305 corresponding to the power supply line VDD, a power supply line 306 corresponding to the power supply line VVDD, and power supply lines 307 corresponding to the power supply line VSS.

The power supply line 305, which is formed over the P-type substrate 201, is electrically coupled to the N-type well 302. The power supply line 306 is formed over the P-type substrate 201 to span across the N-type well 302 in a plan view.

A transistor 35 is formed to provide coupling between the power supply line 305 and the power supply line 306 in the N-type well 302. The gate electrode of the transistor 35 is coupled to the output of the first inverter 37 of a buffer 36. The transistor 35 of the present embodiment may include the same structure as the transistor 25. The buffer 36 may include the same structure as the buffer 26. The term "same structure" refers to the sameness of a circuit or a transistor formed based on the same design layout, allowing for differences resulting from product variation in the size and shape of each structural element constituting the transistors 25 and 35 and the buffers 26 and 36.

In the following, the power switch circuit 210 of the present embodiment will be described with reference to FIG. 10 and FIG. 11.

Figure 10:
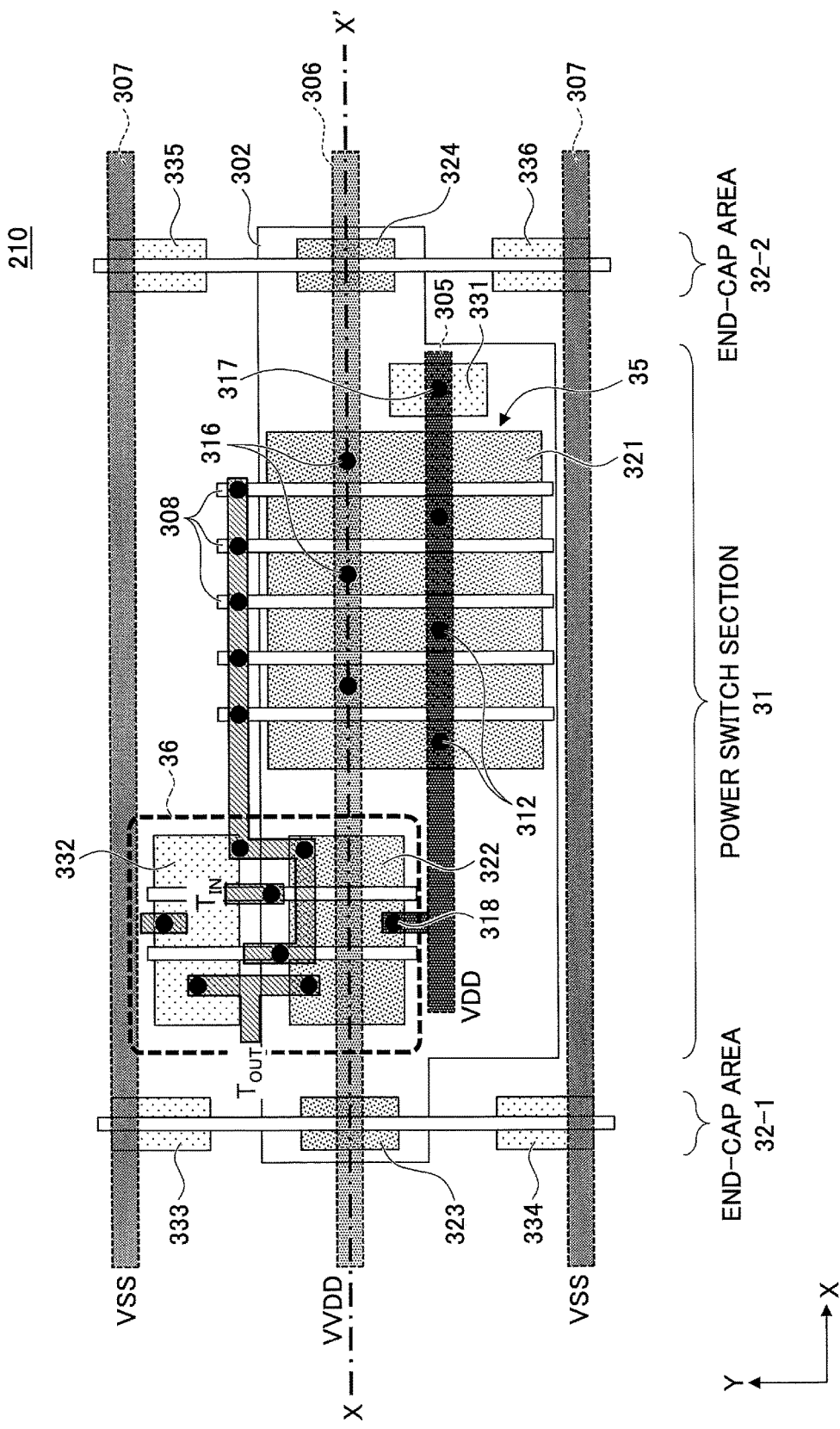
FIG. 10 is a drawing illustrating the layout of the second power switch circuit according to the first embodiment.
Figure 11:
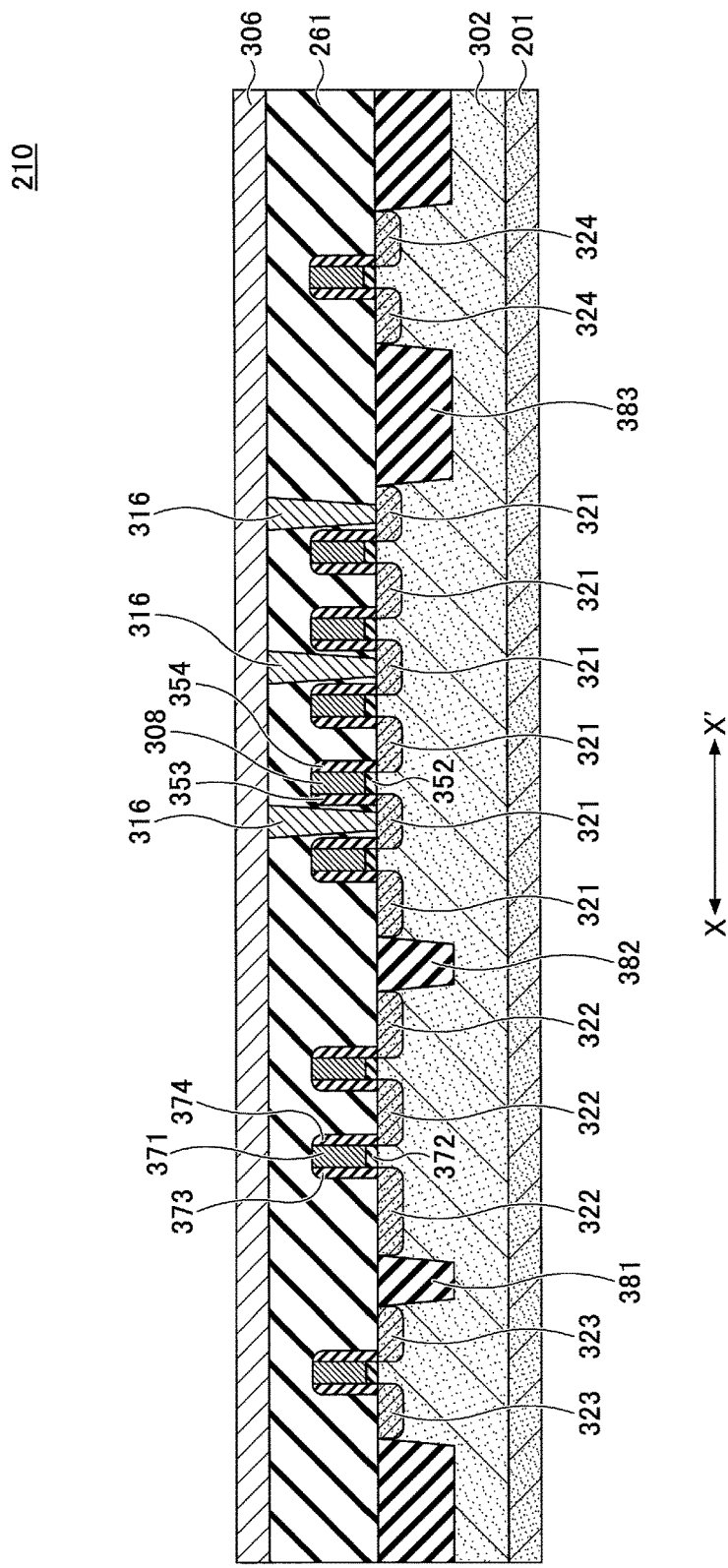
FIG. 11 is a drawing illustrating a cross-section of the second power switch circuit according to the first embodiment.

FIG. 10 is a drawing illustrating the layout of the second power switch circuit according to the first embodiment. FIG. 11 is a drawing illustrating a cross-section of the second power switch circuit according to the first embodiment. FIG. 11 illustrates the cross section taken along the X-X' line in FIG. 10.

The power switch circuit 210 of the present embodiment includes a power switch section and end-cap areas 32-1 and 32-2 formed on the respective sides of the power switch section 31. The end-cap areas 32-1 and 32-2 are the areas in which dummy transistor structures are formed.

In the present embodiment, provision of the end-cap areas 32-1 and 32-2 serves to ensure the homogeneity of transistor production processes, thereby stabilizing the characteristics of transistors.

The power switch circuit 210 of the present embodiment includes the N-type well 302, the power supply lines 305 through 307, gate electrodes 308, P-type impurity regions 321 through 324, N-type impurity regions 331 through 336, and contacts 312 and 316 through 318.

The power switch circuit 210 of the present embodiment includes the N-type well 302 formed in the P-type substrate 201. The P-type impurity regions 321 through 324 and the N-type impurity region 331 are formed in the N-type well 302. In the present embodiment, the N-type impurity region 332 through 336 are formed in the P-type substrate 201.

The P-type impurity regions 321, which have a higher doping concentration than the P-type substrate 201, form the source and drain regions of the transistor 35. The transistor 35 includes the gate electrodes 308, gate insulating films 352, and sidewalls 353 and 354. In the present embodiment, the gate electrodes 308 are electrically coupled to the output of the inverter 37. In the present embodiment, a plurality of transistors 35 may be coupled in parallel to each other.

The transistors of inverters of the buffer 36 include source and drain regions as a part of the P-type impurity regions 322 and the N-type impurity regions 332. The P-type impurity regions 322 have a higher doping concentration than the P-type substrate 201. The transistors of the inverters constituting the buffer 36 include gate electrodes 371, gate insulating films 372, and sidewalls 373 and 374.

The end-cap area 32-1 includes a P-type impurity region 323 and N-type impurity regions 333 and 334, which are coupled to none of the power supply lines 305, 306, and 307. The end-cap area 32-2 includes a P-type impurity region 324 and N-type impurity regions 335 and 336, which are coupled to none of the power supply lines 305, 306, and 307.

The end-cap areas 32-1 and 32-2 adjoin the power switch section 31 on the respective sides thereof.

The power switch circuit 210 of the present embodiment includes the STIs 381 through 383 formed in the P-type substrate 201 between the transistors. Further, a first interlayer insulating film 261 is formed over the P-type substrate 201.

Some of the P-type impurity regions 321 are coupled to the power supply line 305 through the contacts 312 formed through the first interlayer insulating film 261, and the others are coupled to the power supply line 306 through the contacts 316 formed through the first interlayer insulating film 261.

One of the P-type impurity regions 322 is coupled to the power supply line 305 through the contact 318 formed through the first interlayer insulating film 261.

The P-type impurity regions 321 and the P-type impurity regions 322 are isolated from each other by the STI 382. The P-type impurity regions 321 and the N-type impurity region 331 are isolated from each other by the STI 383. The N-type impurity region 331 is coupled to the power supply line 305 through the contact 317 formed through the first interlayer insulating film 261, thereby coupling the N-type well 302 to the power supply line 305.

As described above, the power switch circuit 210 of the present embodiment does not include well-tap areas, thereby having a width in the X direction that is narrower than that of the power switch circuit 200. Placing the power switch circuits 210 in the second area 43 thus serves to reduce the entire circuit size, compared with the case in which the power switch circuits 200 are placed in the second area 43.

In the present embodiment, the dummy transistor structures in the end-cap areas 32-1 and 32-2 do not need to receive the potential of the power supply line VVDD. Unlike the power switch circuit 200, thus, the power switch circuit 210 does not include N-type wells receiving the potential of the power supply line VVDD which needs to be electrically isolated from the N-type well 302. This allows the end-cap areas 32-1 and 32-2 to be disposed near the power switch section 31, which allows the power switch circuit 210 to be made smaller than the power switch circuit 200.

In the present embodiment, the P-type impurity region 323 and the P-type impurity region 324 are both disposed inside the N-type well 302. Alternatively, the P-type impurity region 323 and the P-type impurity region 324 may be formed outside the N-type well 302, i.e., in the P-type substrate 201.

Figure 12:
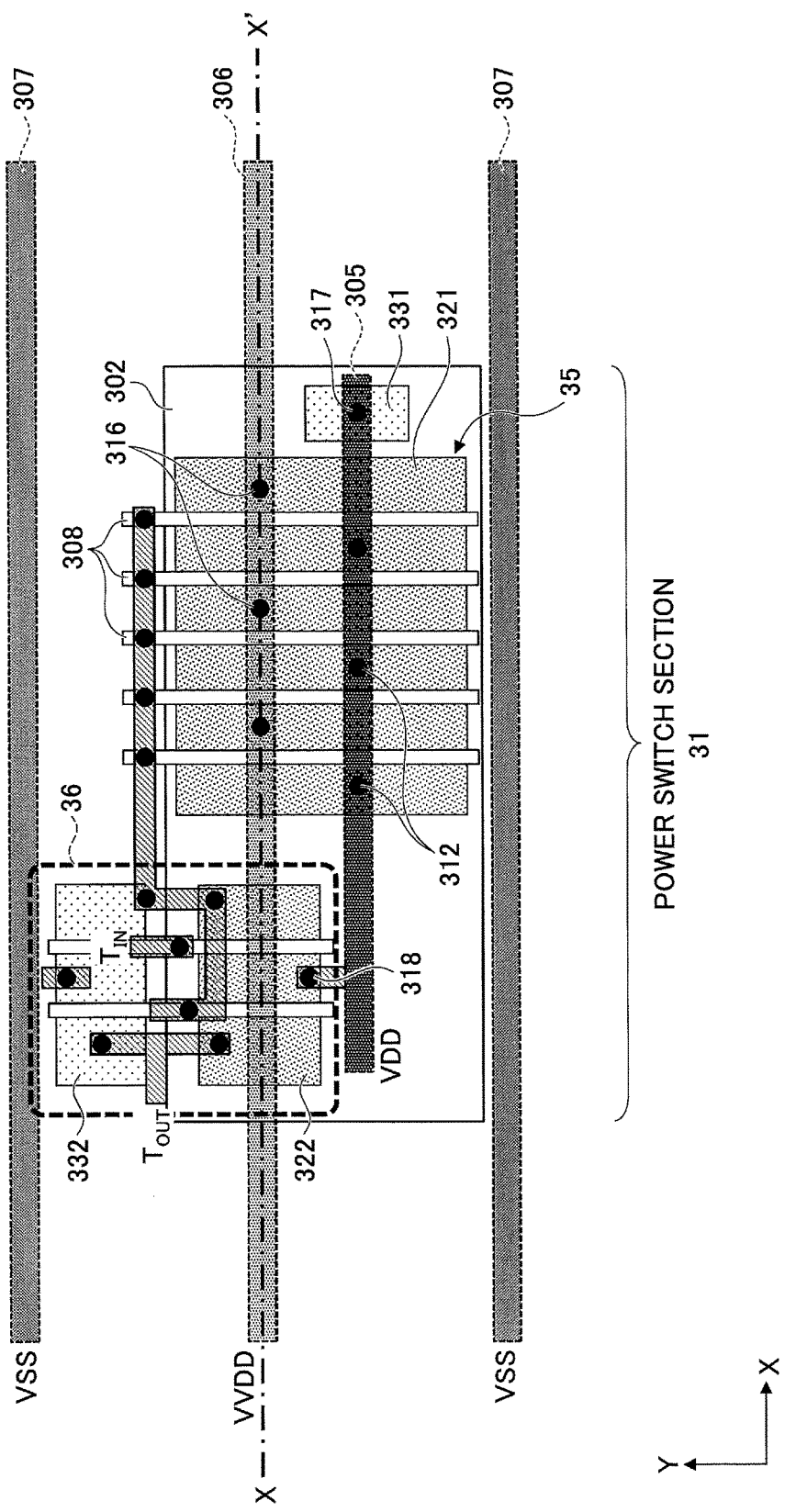
FIG. 12 is a drawing illustrating another layout of the second power switch circuit according to the first embodiment.

The power switch circuit 210 of the present embodiment includes the end-cap areas 32-1 and 32-2. Alternatively, the end-cap areas 32-1 and 32-2 may not be provided. With reference to FIG. 12, a power switch circuit 210A including no end-cap areas 32-1 and 32-2 will be described.

FIG. 12 is a drawing illustrating another layout of the second power switch circuit according to the first embodiment.

The power switch circuit 210A illustrated in FIG. 12 differs from the power switch circuit 210 only in that the end-cap areas 32-1 and 32-2 are not provided.

The absence of the end-cap areas 32-1 and 32-2 allows the size of the power switch circuit 210A illustrated in FIG. 12 to be further reduced than the power switch circuit 210 by a corresponding amount.

The contacts 312 and 316 through 318 of the present embodiment include a glue film which includes titanium nitride, and a tungsten film, for example. The power supply lines 305 through 307 include copper and a barrier metal film which includes tantalum or tantalum nitride, for example. The STIs 381 through 383 may include a silicon dioxide film, for example. In the present embodiment, the gate electrodes 308 and 371 may include polysilicon or metal such as titanium nitride. The gate insulating films 352 and 372 may include a silicon dioxide film or a film which includes one or more materials of an oxide of hafnium, zirconium, lanthanum, yttrium, aluminum, titanium, and tantalum.

Figure 13:
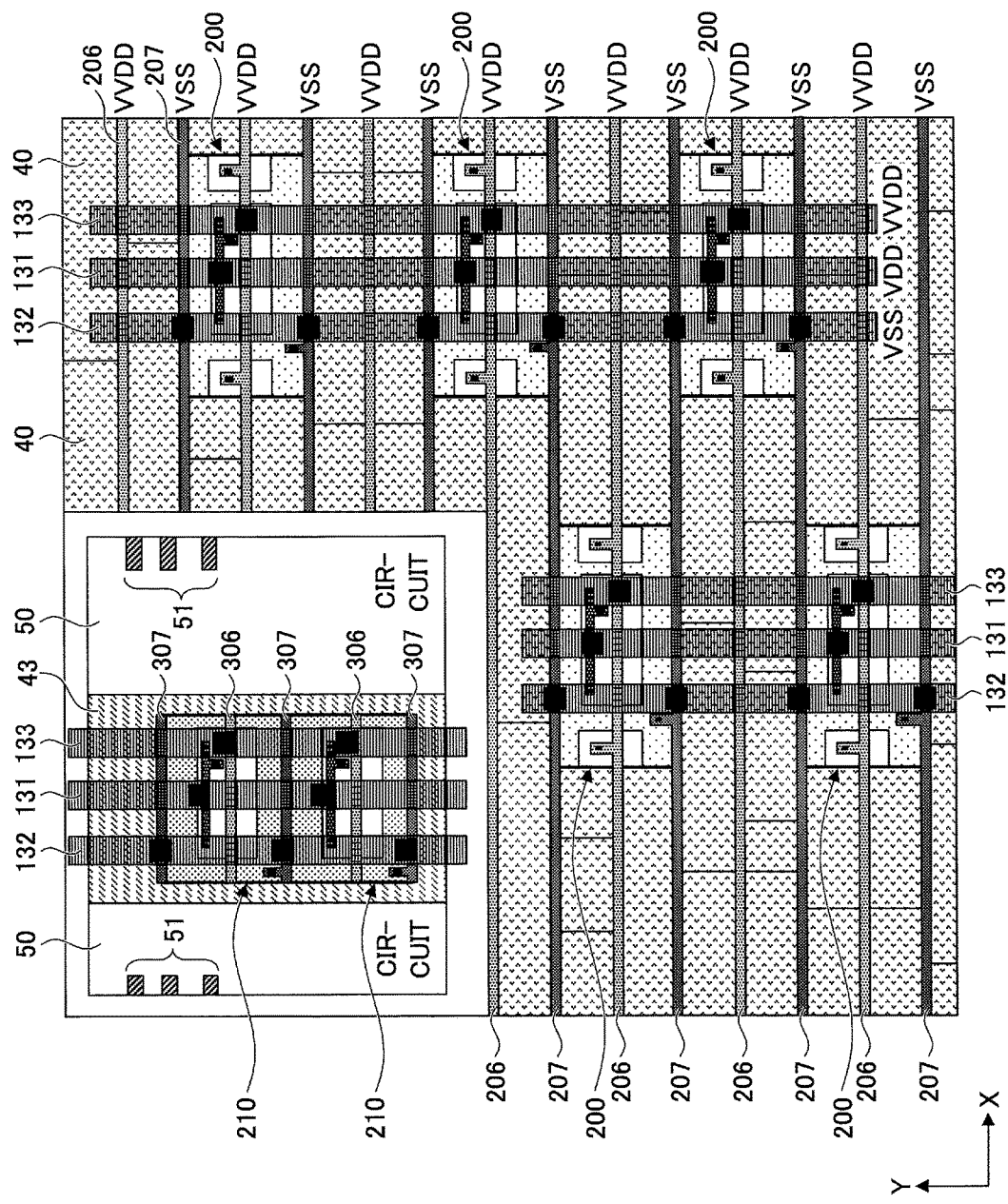
FIG. 13 is a drawing illustrating the power supply lines of the semiconductor device according to the first embodiment.

In the following, the power supply lines of the semiconductor device 30 of the present embodiment will be described with reference to FIG. 13. FIG. 13 is a drawing illustrating the power supply lines of the semiconductor device according to the first embodiment. FIG. 13 illustrates an enlarged view of the second area 43 and the vicinity thereof in the semiconductor device 30 illustrated in FIG. 3.

The semiconductor device 30 includes power supply lines 131, 132, and 133. The power supply lines 131 serve to supply potential to the power supply lines VDD of the power switch circuits 200 and the power switch circuits 210. The power supply lines 132 serve to supply potential to the power supply lines VSS of the power switch circuits 200 and the power switch circuits 210. The power supply lines 133 serve to supply potential to the power supply lines VVDD of the power switch circuits 200 and the power switch circuits 210.

The semiconductor device 30 illustrated in FIG. 13 includes the standard cells 40 disposed in the first area 42 The power supply lines 131, 132, and 133 extend in the Y-axis direction for coupling to the power switch circuits 200 and to the power switch circuits 210.

The power supply lines 131 may be electrically coupled to each other. The power supply lines 132 may be electrically coupled to each other. The power supply lines 133 may be electrically coupled to each other. Specifically, an interconnection coupled to the power supply lines 131, an interconnection coupled to the power supply lines 132, and an interconnection coupled to the power supply lines 133 may be formed in another interconnection layer different from the interconnection layer in which power supply lines 131, 132, and 133 are formed (not shown).

Although the power supply lines 131, 132, and 133 in FIG. 13 are arranged in such a manner as to overlap the power switch circuits 200 or the power switch circuits 210 in a plan view, this is not a limiting example. In the present embodiment, only the power supply lines 131 may be disposed such as to overlap the power switch circuits 200 or the power switch circuits 210 in a plan view, while the power supply lines 132 and 133 may be disposed at any locations in the first area 42 or the second area 43. Although the configuration illustrated in FIG. 13 includes the power supply lines 131, 132, and 133, this is not a limiting example. The semiconductor device 30 illustrated in FIG. 13 includes the power supply lines 132 and 133 for the purpose of coupling the contact points of the power supply lines VSS to each other and coupling the contact points of the power supply lines VVDD to each other. When there is no need for such coupling, only the power supply lines 131 may be provided.

According to the present embodiment described above, power switch circuits usable for respective, different types of target circuits are provided.

Specifically, the present embodiment provides the power switch circuits 200 for target circuits including no areas for applying potential to the substrate, and also provides the power switch circuits 210 for target circuits including areas for applying potential to the substrate. Since the power switch circuit 210 does not include the well-tap areas 22-1 and 22-2, the power switch circuit 210 has a smaller size than the power switch circuit 200. The present embodiment thus serves to reduce the size of the semiconductor device 30.

The circuits 50 and the standard cells 40 in the present embodiment may receive the potential of the power supply line VVDD based on the same power supply line VDD. Specifically, the power supply line 205 and the power supply line 305 may be coupled to each other, and the power supply line 206 and the power supply line 306 may be coupled to each other. Further, the power supply line 207 and the power supply line 307 may be coupled to each other.

The circuits 50 and the standard cells 40 may alternatively receive the potential of the power supply line VVDD based on different power supply lines VDD.

Second Embodiment

In the following, a second embodiment will be described with reference to the accompanying drawings. The second embodiment differs from the first embodiment in that the power switch section includes two buffer-and-transistor stages, and includes two inputs and two outputs. In the description of the second embodiment in the following, differences from the first embodiment are only described. The same or similar elements as those of the first embodiment are referred to by the same or similar reference symbols, and a description thereof will be omitted.

Figure 14:
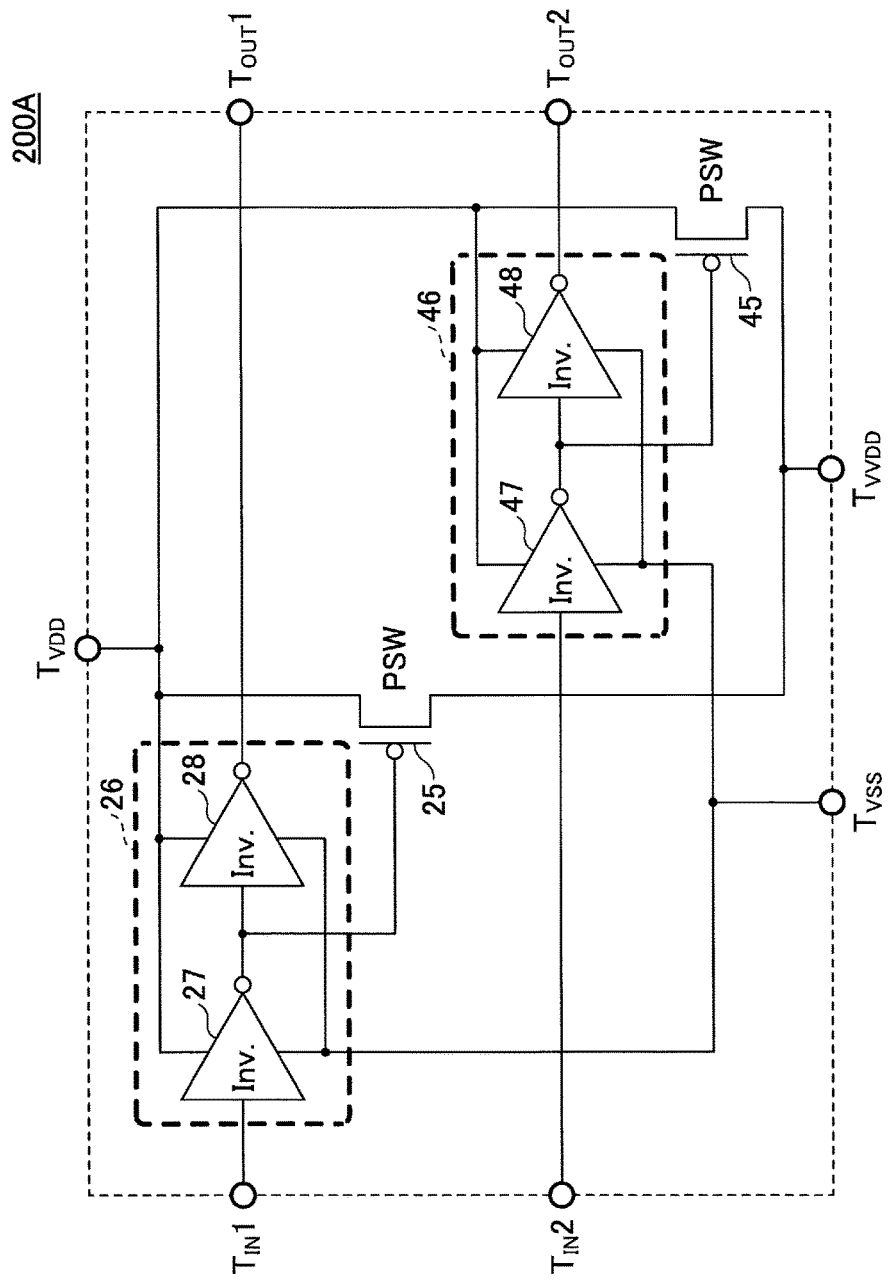
FIG. 14 is a drawing schematically illustrating a power switch circuit according to a second embodiment.

FIG. 14 is a drawing schematically illustrating a power switch circuit according to the second embodiment. FIG. 14 illustrates a power switch circuit 200A as an example.

The power switch circuit 200A of the present embodiment includes transistors 25 and 45, buffers 26 and 46, a $T_{IN}1$ terminal, a $T_{OUT}1$ terminal, a $T_{IN}2$ terminal, a $T_{OUT}2$ terminal, a $T_{VDD}$ terminal, a $T_{VVDD}$ terminal, and a $T_{VSS}$ terminal.

The $T_{IN}1$ terminal, which is coupled to the input of the buffer 26, receives a control signal for controlling whether to supply or cut the power to a target circuit. The $T_{OUT}1$ terminal is coupled to the output of the buffer 26.

The transistor 45 of the present embodiment is a switch transistor. The buffer 46, which includes an inverter 47 and an inverter 48, drives the transistor 45.

The $T_{IN}2$ terminal, which is coupled to the input of the buffer 46, receives a control signal for controlling whether to supply or cut the power to a target circuit. The $T_{OUT}2$ terminal, which is coupled to the output of the buffer 46, transmits the control signal applied to the $T_{IN}2$ terminal. The $T_{VDD}$ terminal, which is coupled to one end of the transistor 45, is coupled to the power supply. The $T_{VVDD}$ terminal, which is coupled to the other end of the transistor 45, is coupled to the target circuit.

The transistor 45 is a PMOS transistor having the on and off states which are controlled in response to the signal supplied from the inverter 47 of the buffer 46. The inverter 47 is coupled between the power supply line VSS and the power supply line VDD via the $T_{VSS}$ terminal and the $T_{VDD}$ terminal, respectively. The $T_{VSS}$ terminal is a ground connection terminal that is coupled to the ground.

In the present embodiment, the on state of the transistor 25 or 45 causes the $T_{VDD}$ terminal and the $T_{VVDD}$ terminal to be coupled to each other, so that the power supply potential to which the $T_{VDD}$ terminal is connected is supplied to the $T_{VVDD}$ terminal. The power supply potential is thus supplied from the $T_{VVDD}$ terminal to the target circuit. In the case of the transistors 25 and 45 being both in the on state, the power supply potential with a larger amount of current than in the case of only one of these being in the on state is supplied to the target circuit.

Figure 15:
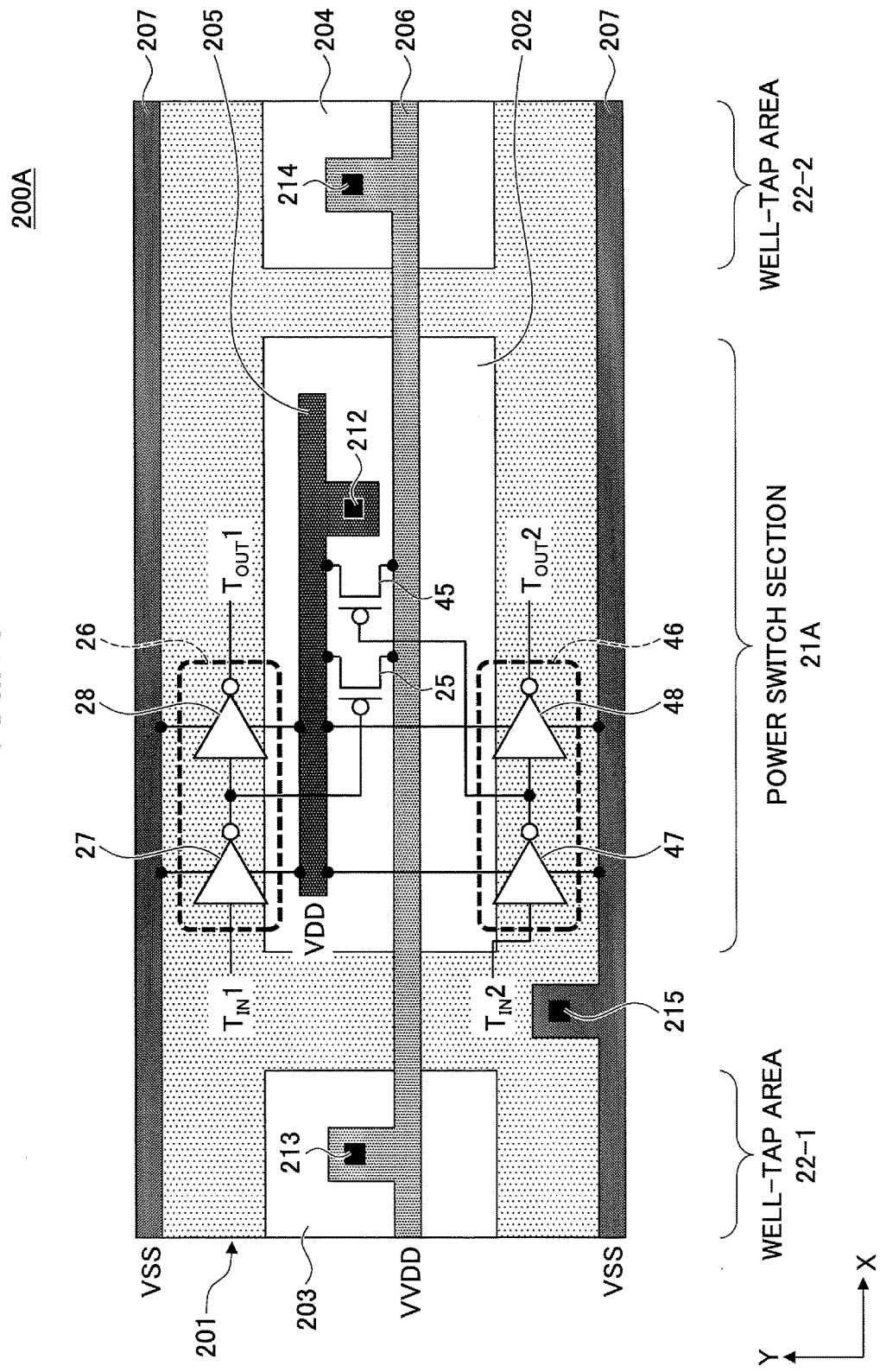
FIG. 15 is a drawing illustrating coupling between the well-tap areas and power supply of a first power switch circuit of the second embodiment.

In the following, coupling between the well-tap areas 22-1 and 22-2 and the power supply to the power switch circuit 200A of the present embodiment will be described with reference to FIG. 15. FIG. 15 is a drawing illustrating coupling between the well-tap areas and power supply of a first power switch circuit of the second embodiment.

A power switch circuit 200A of the present embodiment includes a power switch section 21A and well-tap areas 22-1 and 22-2.

The power switch section 21A includes the transistor 45 connected between the power supply line 205 corresponding to the power supply line VDD and the power supply line 206 corresponding to the power supply line VVDD, with the gate electrode of the transistor 45 being coupled to the inverter 47 at the first stage of the buffer 46. The buffer 46 is coupled between the power supply line 205 and the power supply lines 207.

Figure 16:
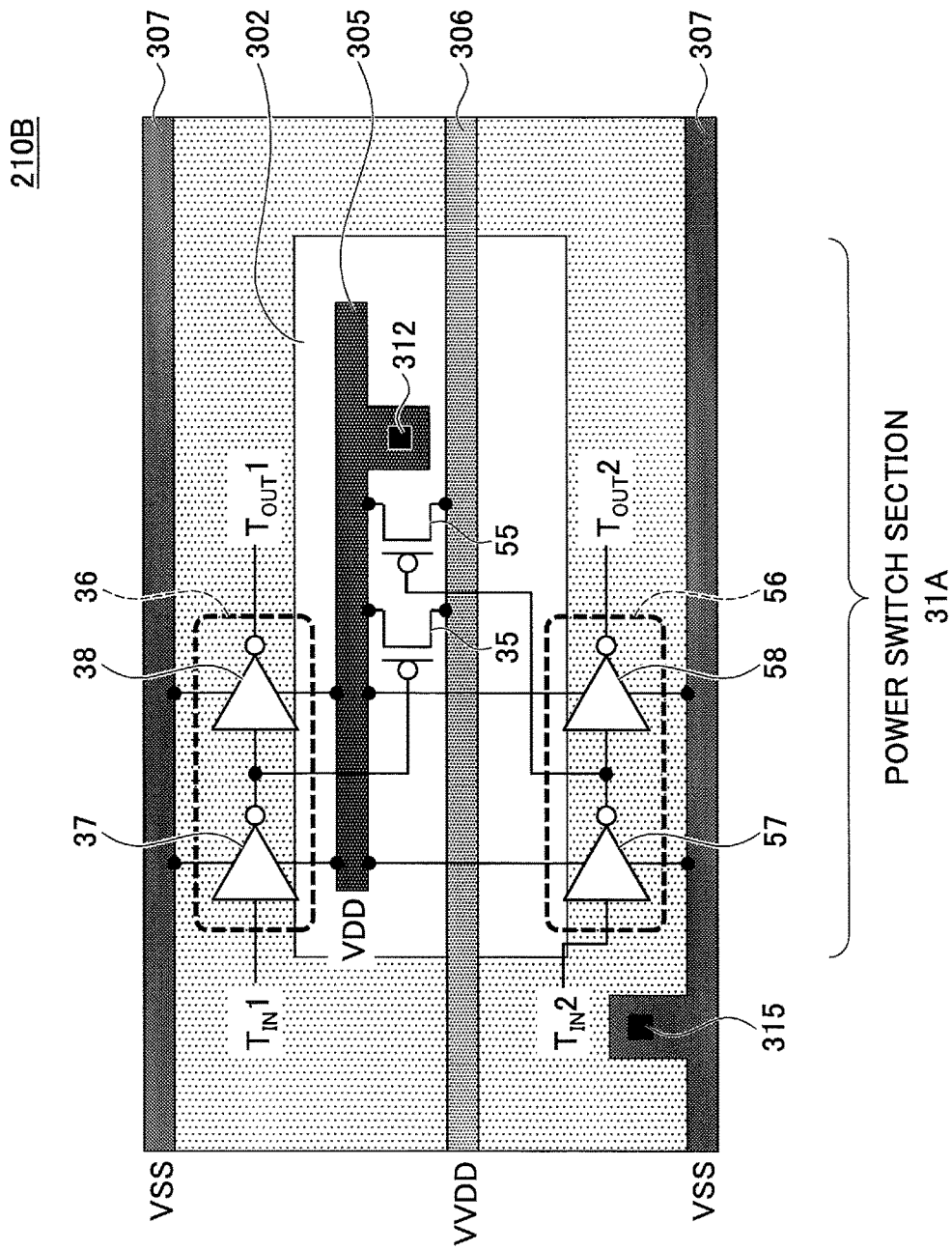
FIG. 16 is a drawing illustrating a second power switch circuit according to the second embodiment.

In the following, a power switch circuit 210B of the present embodiment will be described with reference to FIG. 16. FIG. 16 is a drawing illustrating the second power switch circuit according to the second embodiment.

The power switch circuit 210B of the present embodiment includes the N-type well 302 formed in the P-type substrate 201. The power switch circuit 210B of the present embodiment further includes a power supply line 305 corresponding to the power supply line VDD, a power supply line 306 corresponding to the power supply line VVDD, and power supply lines 307 corresponding to the power supply line VSS.

A transistor 55 is formed to provide coupling between the power supply line 305 and the power supply line 306 in the N-type well 302. The gate electrode of the transistor 55 is coupled to the output of the first inverter 57 of the buffer 56. The transistor 55 of the present embodiment may include the same or similar structure as the transistor 35.

The inverter 57 and the inverter 58 are coupled between the power supply line 305 and the power supply lines 307.

As described above, the power switch circuit 200A and the power switch circuit 210B of the present embodiment include the power switch sections 21A and 31A, respectively, each of which includes 2 inputs and 2 outputs. The configuration of the power switch section 21 is not limited to the configuration used in the first or second embodiment. The power switch section may have any configuration as long as a transistor serving as a switch to control whether to supply or cut the power voltage is provided.

Third Embodiment

In the following, a third embodiment will be described with reference to the accompanying drawings. The third embodiment differs from the first embodiment in that there is an increased number of contact points between the power supply lines 205 and 206 and the P-type impurity regions 221 serving as the source and drain regions of the transistor 25. In the description of the third embodiment in the following, differences from the first embodiment are only described. The same or similar elements as those of the first embodiment are referred to by the same or similar reference symbols, and a description thereof will be omitted.

Figure 17:
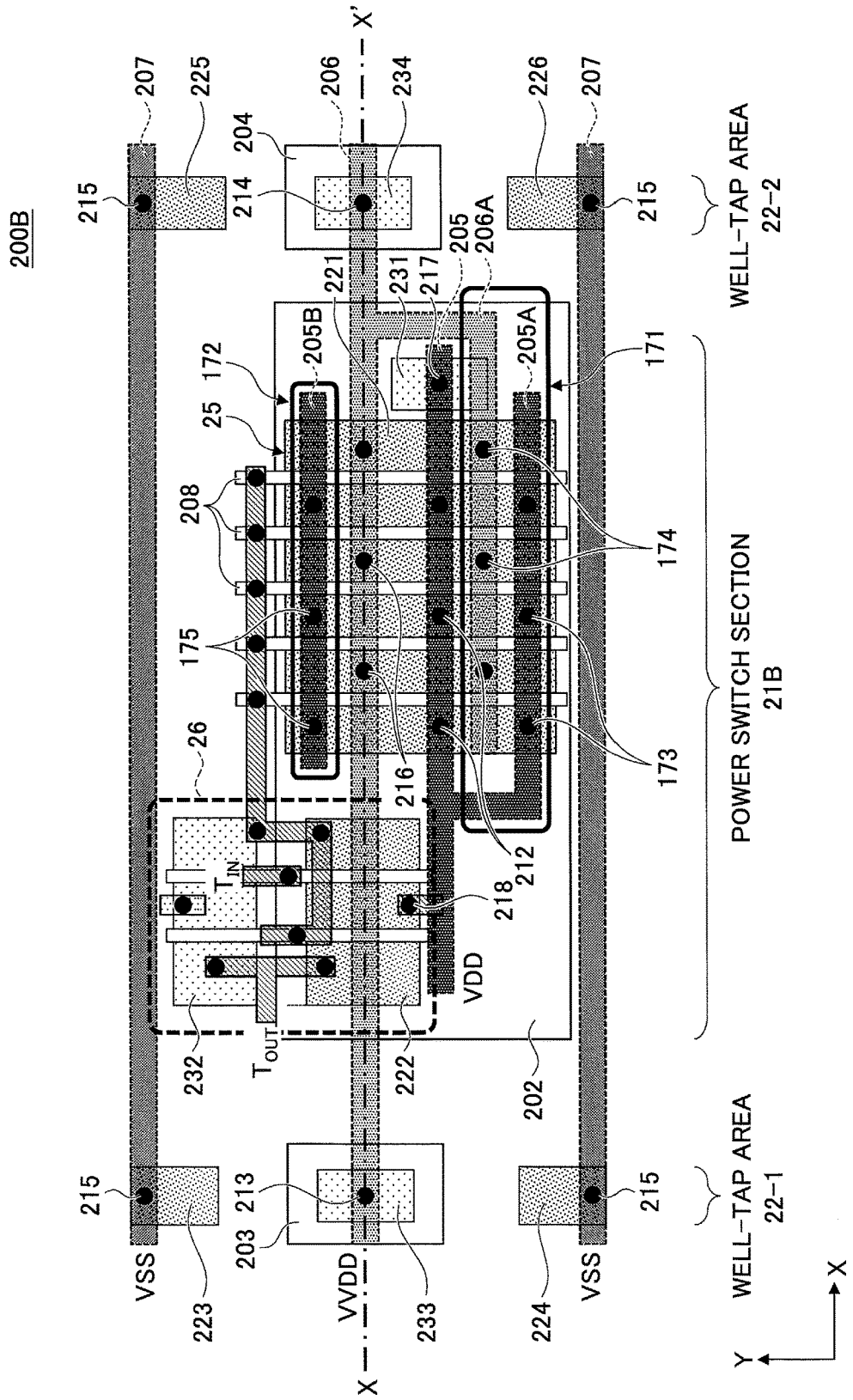
FIG. 17 is a drawing illustrating the layout of the first power switch circuit according to a third embodiment.

FIG. 17 is a drawing illustrating the layout of the first power switch circuit according to the third embodiment. In the power switch circuit 200B of the present embodiment, the power supply lines 205 and 206 bifurcate as shown in an area 171 over the P-type impurity regions 221 formed in the N-type well 202 of the power switch section 21B.

In the present embodiment, a power supply line 205B coupled to the power supply line VDD is formed in an area 172 over the P-type impurity regions 221 of the power switch section 21B.

A power supply line 205A branching off of the power supply line 205 and a power supply line 206A branching off of the power supply line 206 extend in the area 171.

The power supply line 205A is coupled through contacts 173 to the P-type impurity regions 221. The power supply line 206A is coupled through contacts 174 to the P-type impurity regions 221. The power supply line 205B is coupled through contacts 175 to the P-type impurity regions 221.

Namely, the P-type impurity regions 221 are coupled to the power supply lines 205, 205A, and 205B, so that there is an increased number of contact points for coupling to the power supply line VDD compared with the first and second embodiments. The present embodiment thus enables the reduction of resistance along the power supply lines.

Although the power switch circuit 200B was described in connection with FIG. 17, the power supply line 305 and the power supply line 306 may similarly bifurcate in the case of the power switch circuit 210, thereby increasing the number of contact points between the power supply lines and the P-type impurity regions 321 of the transistor 35.

In the following, a FinFET and a nanowire transistor will be described with reference to FIG. 18 and FIG. 19.

Figure 18:
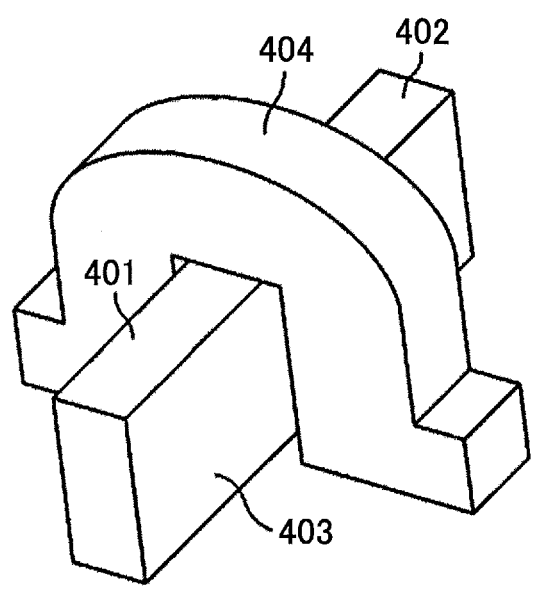
FIG. 18 is a drawing schematically illustrating a FinFET.

FIG. 18 is a drawing schematically illustrating a FinFET. A FinFET 181 illustrated in FIG. 18 includes a three-dimensional structure referred to as a fin 403 serving as a source 401 and a drain 402, unlike a MOS transistor having a two-dimensional structure. The FinFET 181 further includes a gate 404 surrounding the fin 403.

The structure of the FinFET 181 including the fin 403 provides three surfaces of the fin 403 defining the channel region, thereby improving the controllability of a channel.

Figure 19:
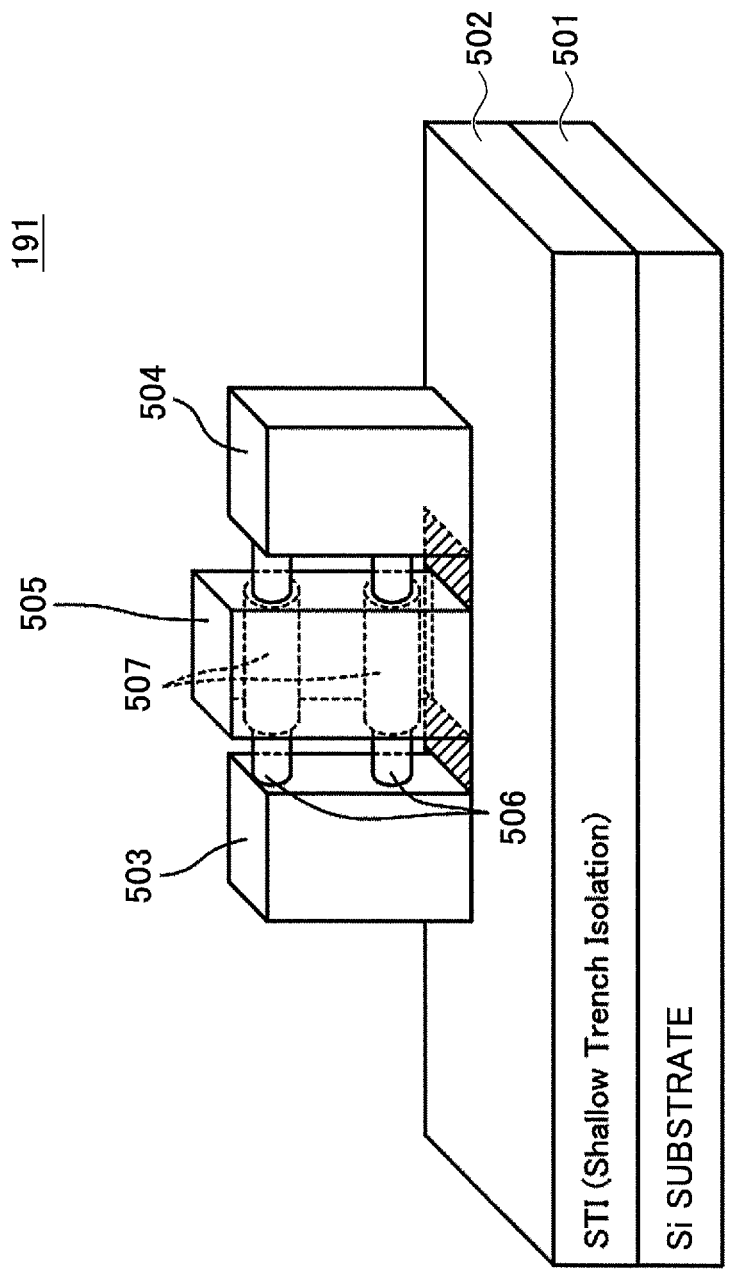
FIG. 19 is a drawing schematically illustrating a nanowire transistor.

FIG. 19 is a drawing schematically illustrating a nanowire transistor. A transistor 191 illustrated in FIG. 19 includes a source region 503 and a drain region 504 projecting from an STI 502 formed in an Si substrate 501.

The source region 503 and the drain region 504 of the transistor 191 are coupled to each other through nanowires 506. Gate insulating films 507 are formed to surround the nanowires 506, and a gate electrode 505 is formed to cover the gate insulating films 507. Electric current flows through the nanowires 506 when the transistor 191 is in the on state.

The FinFETs illustrated in FIG. 18 or nanowire transistors illustrated in FIG. 19 may be used as the first through third transistors 25, 35, 45, and 55.

Although the invention has been described by referring to embodiments, the invention is not limited to the configurations of these embodiments. Various variations and modifications may be made without departing from the scope of the present invention, and may be made in accordance with applications.

What is claimed is:

1. A semiconductor device, comprising:
   a first circuit formed in a semiconductor substrate;
   a second circuit formed in the semiconductor substrate;
   a first power supply line;
   a second power supply line coupled to the first circuit;
   a first ground line;
   a third power supply line;
   a fourth power supply line coupled to the second circuit;
   a second ground line;
   a first switch circuit including a first switch transistor and a well tap of the semiconductor substrate, the first switch transistor including a first source and a first drain, one of the first source and the first drain being coupled to the first power supply line, another of the first source and the first drain being coupled to the second power supply line, and the well tap being electrically coupled to the second power supply line; and
   a second switch circuit including a second switch transistor, the second switch transistor including a second source and a second drain, one of the second source and the second drain being coupled to the third power supply line, another of the second source and the second drain being coupled to the fourth power supply line, the second switch circuit including no well tap of the semiconductor substrate electrically coupled to the fourth power supply line.

2. The semiconductor device as claimed in claim 1, wherein the second power supply line, the fourth power supply line, the first ground line, and the second ground line extend in a first direction, and a length of the second switch circuit in the first direction is shorter than a length of the first switch circuit in the first direction.

3. The semiconductor device as claimed in claim 2, wherein
   the first switch circuit is located alongside the first circuit, and
   the second switch circuit is located alongside the second circuit.

4. The semiconductor device as claimed in claim 2, wherein
   the semiconductor device includes a plurality of the second switch circuits,
   the plurality of the second switch circuits are arranged alongside the second circuit, and
   the second switch circuits are aligned in a second direction perpendicular to the first direction.

5. The semiconductor device as claimed in claim 2, wherein
   the semiconductor device includes a plurality of the second circuits, and
   the second switch circuit is located between two of the second circuits in a plan view.

6. The semiconductor device as claimed in claim 2, wherein the fourth power supply line and the second ground line are terminated at an edge of a design area which includes the first circuit and the second circuit, and the second switch circuit is located between the edge of the design area and the second circuit.

7. The semiconductor device as claimed in claim 2, wherein the second switch circuit include end-cap areas arranged alongside the second switch transistor on respective sides of the second switch transistor in the first direction.

8. The semiconductor device as claimed in claim 2, wherein a second circuit includes a terminal electrically coupled to the first circuit, the terminal is located at a first side of the second circuit, and the second switch circuit is located alongside a second side of the second circuit which is opposite to the first side.

9. The semiconductor device as claimed in claim 2, wherein the first power supply line bifurcates in the first switch circuit in a plan view, the second power supply line bifurcates in the first switch circuit in a plan view, the first power supply line is coupled to one of the first source and the first drain of the first switch transistor via a plurality of first contacts which are formed on the semiconductor substrate, the second power supply line is coupled to another of the first source and the first drain of the first switch transistor via a plurality of second contacts which are formed on the semiconductor substrate, the third power supply line bifurcates in the second switch circuit in a plan view, the fourth power supply line bifurcates in the second switch circuit in a plan view, the third power supply line is coupled to one of the second source and the second drain of the second switch transistor via a plurality of third contacts which are formed on the semiconductor substrate, and the fourth power supply line is coupled to another of the second source and the second drain of the second switch transistor via a plurality of fourth contacts which are formed on the semiconductor substrate.

10. The semiconductor device as claimed in claim 1, wherein the first switch transistor and the second switch transistor have the same structure.

* * * * *